United States Patent
Bates et al.

(10) Patent No.: US 11,628,467 B2
(45) Date of Patent: Apr. 18, 2023

(54) SELECTIVE COATING OF A STRUCTURE

(71) Applicant: The Regents of the University of California, Oakland, CA (US)

(72) Inventors: Christopher Bates, Santa Barbara, CA (US); Yuanyi Zhang, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 24 days.

(21) Appl. No.: 16/697,288

(22) Filed: Nov. 27, 2019

(65) Prior Publication Data
US 2020/0238331 A1    Jul. 30, 2020

Related U.S. Application Data

(60) Provisional application No. 62/796,753, filed on Jan. 25, 2019.

(51) Int. Cl.
*B05D 1/32*    (2006.01)
*C09D 133/02*    (2006.01)
(Continued)

(52) U.S. Cl.
CPC ............ *B05D 1/32* (2013.01); *B05D 1/002* (2013.01); *B05D 1/005* (2013.01);
(Continued)

(58) Field of Classification Search
CPC ........ B05D 1/002; B05D 1/005; B05D 1/185; B05D 1/204; B05D 1/32; B05D 1/36;
(Continued)

(56) References Cited

U.S. PATENT DOCUMENTS 4,576,834 A * 3/1986 Sobczak ............ H01L 21/02164
427/259
7,776,758 B2 * 8/2010 Duan ................. H01L 21/28229
438/758
(Continued)

FOREIGN PATENT DOCUMENTS

CN    1535305 A  * 10/2004   ............ C08F 265/04
EP    0662683 A1    7/1995
(Continued)

OTHER PUBLICATIONS

Bhandaru et al. "Ordered Alternating Binary Polymer Nanodroplet Array By Sequential Spin Dewetting"; Nanoletters, vol. 14, May 30, 2017, American Chemical Society, 8 pages (Year: 2017).*
(Continued)

*Primary Examiner* — Brian K Talbot
(74) *Attorney, Agent, or Firm* — Withrow & Terranova, P.L.L.C.

(57) ABSTRACT

A method of coating a structure is disclosed. Method steps include providing a structure having a first portion of a first material having a first surface and providing a second portion of a second material having a second surface, wherein a mask is provided over the first surface. Another step includes exposing the mask and the second surface to a solution comprising a polymer and a solvent, wherein the solution dewets from the mask and the polymer collects onto the second surface to form a polymer coating over the second surface without forming a polymer coating on the first surface.

29 Claims, 25 Drawing Sheets

(51) Int. Cl.
| | |
|---|---|
| C09D 125/06 | (2006.01) |
| B05D 1/00 | (2006.01) |
| C08F 293/00 | (2006.01) |
| C09D 155/00 | (2006.01) |
| H01L 21/67 | (2006.01) |
| G03F 7/16 | (2006.01) |
| B05D 1/36 | (2006.01) |

(52) U.S. Cl.
CPC ........ *C08F 293/005* (2013.01); *C09D 125/06* (2013.01); *C09D 133/02* (2013.01); *C09D 155/005* (2013.01); *B05D 1/36* (2013.01); *C08F 2438/01* (2013.01); *G03F 7/162* (2013.01); *H01L 21/6715* (2013.01)

(58) Field of Classification Search
CPC ......... B05D 3/101; B05D 3/102; G03F 7/162; H01L 21/6715
USPC .................................................. 427/240, 282
See application file for complete search history.

(56) References Cited

U.S. PATENT DOCUMENTS

| | | | | |
|---|---|---|---|---|
| 8,263,192 | B2* | 9/2012 | Koberstein | C07K 17/00 427/407.1 |
| 10,157,740 | B1* | 12/2018 | Ouyang | B05D 1/005 |
| 10,492,305 | B2* | 11/2019 | Stay | G06F 3/041 |
| 10,643,840 | B2* | 5/2020 | Anthis | H01L 21/02172 |
| 10,790,138 | B2* | 9/2020 | Azumo | H01L 21/76826 |
| 2004/0102050 | A1* | 5/2004 | Delamarche | B82Y 40/00 438/734 |
| 2009/0004507 | A1 | 1/2009 | Suzuki | |
| 2011/0034033 | A1* | 2/2011 | Halls | H01L 51/0012 438/758 |
| 2012/0315740 | A1* | 12/2012 | Yao | H01L 21/02118 438/468 |
| 2014/0027727 | A1 | 1/2014 | Lee et al. | |
| 2014/0314982 | A1 | 10/2014 | Paxson et al. | |
| 2015/0027769 | A1* | 1/2015 | Sebastien | B05D 1/32 174/262 |
| 2015/0217330 | A1* | 8/2015 | Haukka | C23C 18/1216 427/343 |
| 2016/0003760 | A1 | 1/2016 | Etzkorn | |
| 2017/0037513 | A1* | 2/2017 | Haukka | C23C 16/04 |
| 2017/0323776 | A1* | 11/2017 | Farm | H01L 21/02181 |
| 2017/0323781 | A1* | 11/2017 | Kachian | C23C 16/04 |
| 2018/0012752 | A1* | 1/2018 | Tapily | C23C 16/405 |
| 2018/0217312 | A1 | 8/2018 | Hiraoka et al. | |
| 2018/0233349 | A1* | 8/2018 | Smith | H01L 21/02274 |
| 2018/0366317 | A1* | 12/2018 | Ke | H01L 21/02334 |
| 2019/0157079 | A1* | 5/2019 | Ke | C23C 16/04 |
| 2019/0295943 | A1 | 9/2019 | Tan | |
| 2019/0316256 | A1* | 10/2019 | Bhuyan | H01L 21/0228 |
| 2019/0326114 | A1* | 10/2019 | Kachian | H01L 21/02532 |
| 2019/0384161 | A1* | 12/2019 | Mirkin | G03F 1/54 |
| 2020/0238329 | A1* | 7/2020 | Bates | C09D 133/16 |

FOREIGN PATENT DOCUMENTS

| | | | | |
|---|---|---|---|---|
| GB | 2455746 | * | 6/2009 | ............ H01L 51/40 |
| KR | 20060003332 A | * | 1/2006 | |

OTHER PUBLICATIONS

Bally-Le Gall, F. et al., "Free-Standing Nanomembranes Based on Selective CVD Deposition of Functional Poly-p-xylylenes," ACS Nano, vol. 9, Issue No. 2, Feb. 3, 2015, American Chemical Society, 8 pages.

Bhandaru, N. et al., "Ordered Alternating Binary Polymer Nanodroplet Array by Sequential Spin Dewetting," Nano Letters, vol. 14, May 30, 2017, American Chemical Society, 8 pages.

Bhandaru, N. et al., "Directed Ordering of Phase Separated Domains and Dewetting of Thin Polymer Blend Films on a Topographically Patterned Substrate," Soft Matter, vol. 13. 2017, Royal Society of Chemistry, 11 pages.

Boltau, M. et al., "Surface-induced structure formation of polymer blends on patterned substrates," Letters to Nature, vol. 391, Feb. 26, 1998, pp. 877-879.

Briggs, B. et al., "Fully Aligned Via Integration for Extendibility of Interconnects to Beyond the 7 nm Node," 2017 IEEE International Electron Devices Meeting (IEDM), 2017, IEEE, 4 pages.

Chavez, K. et al., "A Novel Method of Etching Copper Oxide Using Acetic Acid," Journal of The Eletrochemical Society, vol. 148, Issue No. 11, Oct. 8, 2001, The Electrochemical Society, Inc., 4 pages.

Chen, H.Y. et al., "Substrate-Selective Chemical Vapor Deposition of Reactive Polymer Coatings," Advanced Materials, vol. 20, Sep. 5, 2008, WILEY-VCH Verlag GmbH & Co. KGaA, Weinheim, 7 pages.

Chen, Y. et al. "Technological Merits, Process Complexity, and Cost Analysis of Self-aligned Multiple Patterning," SPIE Advanced Lithography, 2012, San Jose, California, United States, Optical Microlithography vol. XXV, Issue No. 832620, SPIE, Mar. 13, 2012, 15 pages.

Chiu, M. et al., "Aligned Droplet Patterns by Dewetting of Polymer Bilayers", Macromolecules, vol. 51, Issue No. 15, Jul. 5, 2018, American Chemical Society Publications, 9 pages.

Dhara, P. et al., "Transition from Spin Dewetting to Continuous Film in Spin Coating of Liquid Crystal 5CB", Scientific Reports, vol. 8, Issue No. 7169, May 8, 2018, www.nature.com, 9 pages.

Discekici, E.H. et al., "Light-Mediated Atom Transfer Radical Polymerization of Semi-Fluorinated (Meth)acrylates: Facile Access to Functional Materials," Journal of the American Chemical Society, vol. 139, 2017, ACS Publications, 7 pages.

Fang, M. et al., "Area-Selective Atomic Layer Deposition: Conformal Coating, Subnanometer Thickness Control, and Smart Positioning," ACS Nano, vol. 9, Issue No. 9, Sep. 9, 2015, American Chemical Society Publications, 4 pages.

Ferrell, N. et al., "Fabrication of Micro- and Nanoscale Polymer Structures by Soft Lithography and Spin Dewetting," Macromolecular Rapid Communications, vol. 28, 2007, Wiley-V CH Verlag GmbH, pp. 966-971.

Geoghegan, M. et al., "Thin Polymer Films on Chemically Patterned, Corrugated Substrates," Journal of Physics: Condensed Matter, vol. 17, Issue No. 9, IOP Publishing, Ltd., Feb. 18, 2005, 15 pages.

Glass, N. et al., "Organosilane Deposition for Microfluidic Applications," Biomicrofluidics, vol. 5, Issue No. 3, Aug. 16, 2011, American Institute of Physics, 7 pages.

Grischuk, A. et al., "Viscosity of Concentrated Solutions of Polystyrene and Poly(Vinyl Acetate) (Empirical Equations)," Russian Journal of Applied Chemistry, Macromolecular Chemistry and Polymeric Materials, vol. 80, Issue No. 11, Nov. 2007, Pleiades Publishing, Ltd., 5 pages.

Hall, D.B. et al., "Spin Coating of Thin and Ultrathin Polymer Films," Polymer Engineering and Science, vol. 38, No. 12, Dec. 1998, 7 pages.

Johnson, A. "Micrometre and Nanometre Scale Patterning of Binary Polymer Brushes, Supported Lipid Bilayers and Proteins," Chemical Science, vol. 8, Issue No. 4517, Apr. 18, 2017, The Royal Society of Chemistry, 10 pages.

Kalanyan, B. "Using Hydrogen To Expand the Inherent Substrate Selectivity Window During Tungsten Atomic Layer Deposition," Chemistry of Materials, vol. 28, Issue No. 1, Dec. 15, 2015, American Chemical Society Publications, 10 pages.

Kim, W.-H. et al., "A Process for Topographically Selective Deposition on 3D Nanostructures by Ion Implantation," ACS Nano, 2016, vol. 10, ACS Publications, 8 pages.

Lee, J.H., et al., "Spontaneous Registration of Sub-10 nm Features Based on Subzero Celsius Spin-Casting of Self-Assembling Building Blocks Directed by Chemically Encoded Surfaces," ACS Nano, Issue 12, vol. 8, Aug. 1, 2018, ACS Publications, 10 pages.

Li, M.-Y. et al., "Self-Aligned and Scalable Growth of Monolayer WSe2-MoS2 Lateral Heterojunctions," Advanced Functional Materials, vol. 28, 2018, Wiley-V CH Verlag GmbH, 7 pages.

(56) References Cited

OTHER PUBLICATIONS

Liu, J., et al., "Generation of Oxide Nanopatterns by Combining Self-Assembly of S-Layer Proteins and Area-Selective Atomic Layer Deposition," Journal of the American Chemical Society, vol. 130, Issue No. 50, Nov. 19, 2008, American Chemical Society, 6 pages.

Lu, G. et al., "Fabricating Ordered Two-Dimensional Arrays of Polymer Rings with Submicrometer-Sized Features on Patterned Self-Assembled Monolayers by Dewetting," Advanced Materials, vol. 14, No. 15, Aug. 5, 2002, Wiley-V CH Verlag GmbH, pp. 1049-1053.

Mackus, A. et al., "From the Bottom-Up: Toward Area-Selective Atomic Layer Deposition with High Selectivity," Chemistry of Materials, vol. 31, 2019, American Chemical Society, 11 pages.

Mackus, A. et al., "The Use of Atomic Layer Deposition in Advanced Nanopatterning," Nanoscale, vol. 6, 2014, Royal Society of Chemistry, 20 pages.

Meyerhofer, D., "Characteristics of Resist Films Produced by Spinning," Journal of Applied Physics, vol. 49, Issue 7, Aug. 12, 2008, American Institute of Physics, 6 pages.

Park, K. et al., "Light Stamping Lithography: Microcontact Printing without Inks," Journal of the American Chemical Society, vol. 128, 2006, American Chemical Society, pp. 858-865.

Park, K. et al., Microcontact Patterning of Ruthenium Gate Electrodes by Selective Area Atomic Layer Deposition, Applied Physical Letters, vol. 86, Jan. 26, 2005, AIP Publishing, 4 pages.

Prasittichai, C. et al., "Area Selective Molecular Layer Deposition of Polyurea Films," Applied Materials & Interfaces, vol. 5, 2013, 6 pages.

Pujari, S. et al., "Covalent Surface Modification of Oxide Surfaces," Angewandte Chemie International Edition, vol. 53, Oct. 8, 2001, Wiley-VCH Verlag GmbH & Co. KGaA, Weinheim, 35 pages.

Reiter, G., "Dewetting of Thin Polymer Films," Physical Review Letters, vol. 68, Issue No. 1, Jan. 6, 1992, The American Physical Society, 6 pages.

Rockford, L. et al., "Polymers on Nanoperiodic, Heterogeneous Surfaces," Physical Review Letters, vol. 82, No. 12, Mar. 22, 1999, The American Physical Society, pp. 2602-2605.

Sadat, F. et al., "A New Resist for Area Selective Atomic and Molecular Layer Deposition on Metal-Dielectric Patterns," The Journal of Physical Chemistry, vol. 118, 2014, ACS Publications, American Chemical Society, 6 pages.

Sehgal, A. et al., "Pattern-Directed Dewetting of Ultrathin Polymer Films," Langmuir, vol. 18, 2002, American Chemical Society, pp. 7041-7048.

Seo, E.K. et al., "Atomic Layer Deposition of Titanium Oxide on Self-Assembled-Monolayer-Coated Gold," Chemistry of Materials, vol. 16, 2004, American Chemical Society, pp. 1878-1883.

Sinha, A. et al., "Area-Selective ALD of Titanium Dioxide Using Lithographically Defined Poly(methyl methacrylate) Films," Journal of The Electrochemical Society, vol. 153, Issue No. 5, Mar. 27, 2006, The Electrochemical Society, 5 pages.

Sprenger, M. et al., "Hierarchical Pattern Replication by Polymer Demixing," Advanced Materials, vol. 15, No. 9, May 2, 2003, Wiley-V CH Verlag GmbH, pp. 703-706.

Wang, X. et al., "PEDOT Surface Energy Pattern Controls Fluorescent Polymer Deposition by Dewetting," Thin Solid Films, vol. 449, Issues 1-2, Feb. 2004, Elsevier B.V., 8 pages.

Wei, M. et al., "Directed Assembly of Polymer Blends Using Nanopatterned Templates", Feb. 9, 2009, Wiley-VCH Verlag GmbH & Co. KGaA, Weinheim, 5 pages.

Zhang, Y. et al., "Rapid and Selective Deposition of Patterned Thin Films on Heterogeneous Substrates via Spin Coating," ACS Applied Materials & Interfaces, vol. 11, 2019, American Chemical Society, 7 pages.

Zhang, Y. et al., "Selective spin-on deposition of polymers on heterogeneous surfaces," Proceedings of SPIE vol. 10960, SPIE Advanced Lithography, 2019, San Jose, CA, 11 pages.

Zhang, Z. et al. "Patterning thin polymer Films by Surface-directed Dewetting and Pattern Transfer," Polymer, vol. 44, Issue No. 13, Jun. 2003, Elsevier, 7 pages.

Hashemi, F.S.M., "A New Resist for Area Selective Atomic and Molecular Layer Deposition on Metal-Dielectric Patterns," The Journal of Physical Chemistry, vol. 118, Issue No. 20, May 2, 2014, American Chemical Society Publications, 6 pages.

Non-Final Office Action for U.S. Appl. No. 16/549,490, dated Mar. 7, 2022, 14 pages.

Final Office Action for U.S. Appl. No. 16/549,490, dated Jul. 26, 2022, 16 pages.

Advisory Action for U.S. Appl. No. 16/549,490, dated Oct. 3, 2022, 3 pages.

Non-Final Office Action for U.S. Appl. No. 16/549,490, dated Nov. 21, 2022, 15 pages.

\* cited by examiner

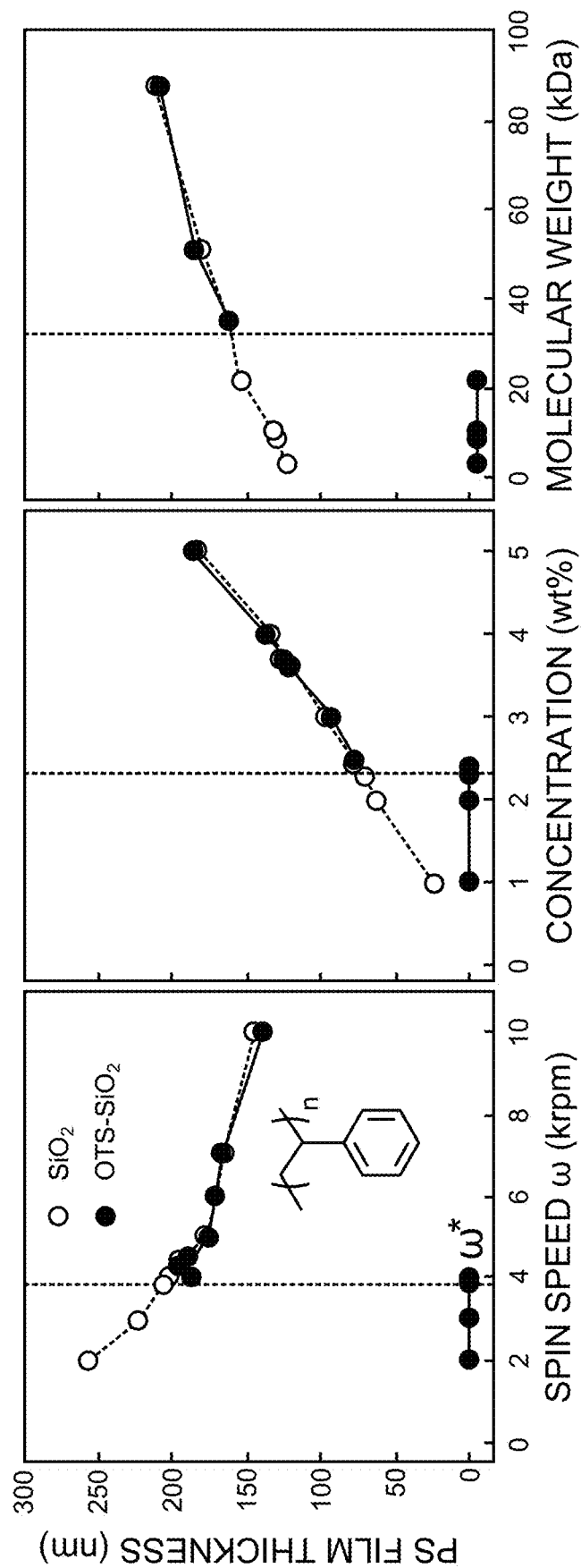

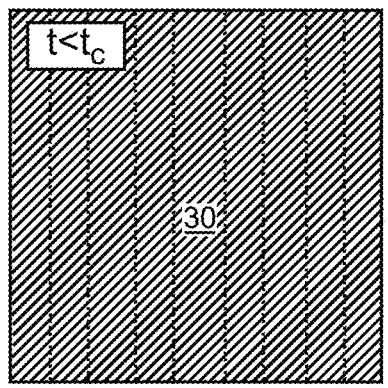
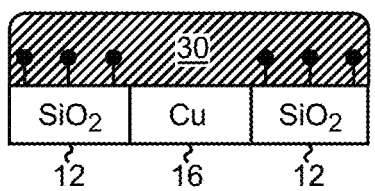
FIG. 14A
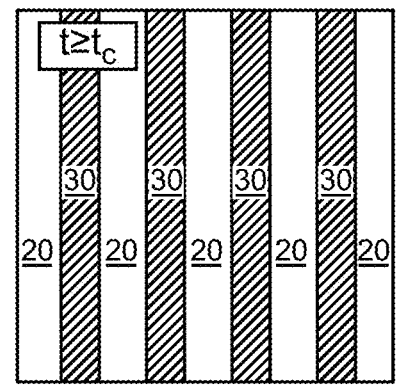
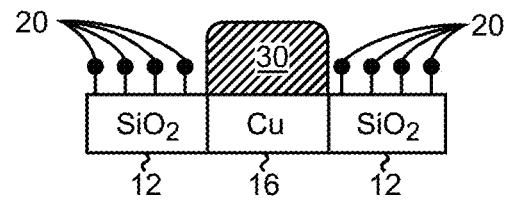
FIG. 14B
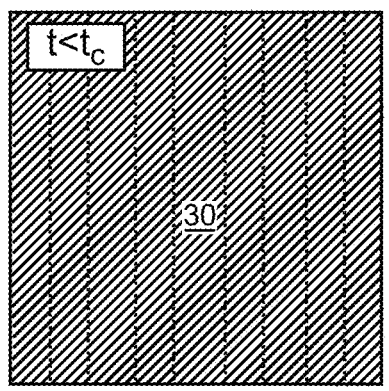
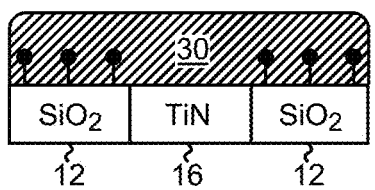
FIG. 14C
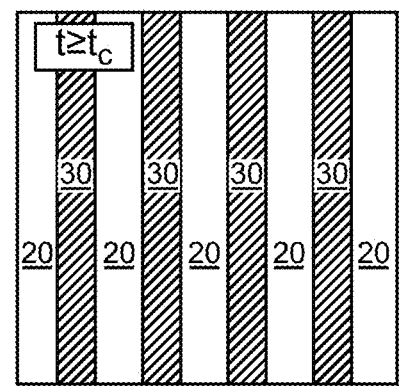
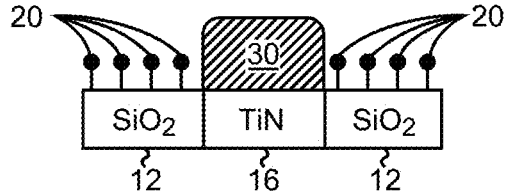
FIG. 14D

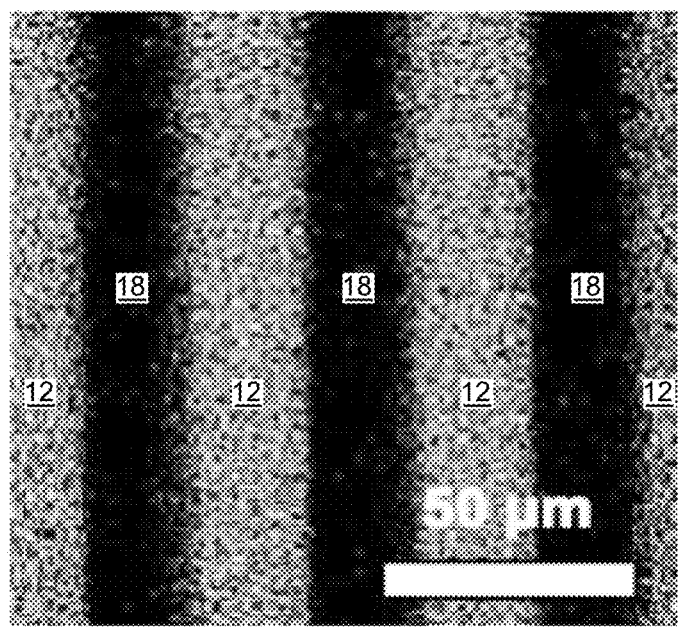
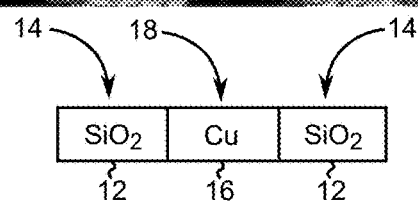
FIG. 16
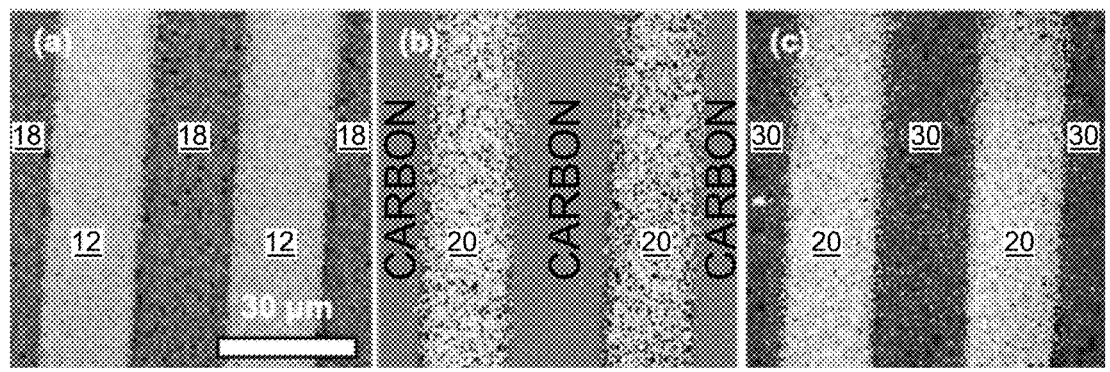
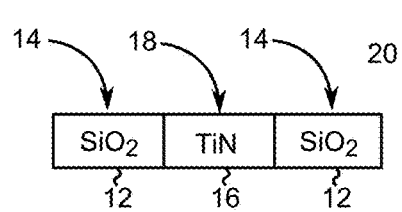
FIG. 17A
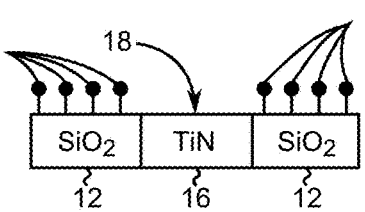
FIG. 17B
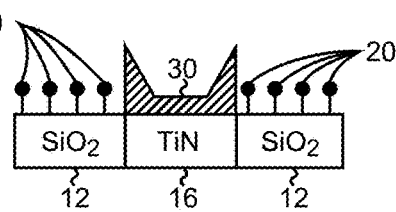
FIG. 17C

SELECTIVE COATING OF A STRUCTURE

RELATED APPLICATIONS

This application claims the benefit of provisional patent application Ser. No. 62/796,753, filed Jan. 25, 2019, the disclosure of which is hereby incorporated herein by reference in its entirety.

FIELD OF THE DISCLOSURE

The present disclosure relates generally to methods of photolithographic processing used in fabricating advanced devices.

BACKGROUND

Photolithographic processes that underpin contemporary technology rely on iterative thin-film processing to construct complex three-dimensional structures constituting advanced devices. An unceasing demand for faster speeds and higher densities continues to drive the development of ever more intricate design targets. Examples include fin field-effect transistors to reduce gate delay and self-aligned multiple patterning to circumvent the optical diffraction limit. Such goals inevitably lead to more involved fabrication, which increases costs.

Device fabrication approaches that selectively deposit material onto certain regions of heterogeneous substrates could lead in principle to simpler processing sequences that reduce the economic burden of next-generation photolithography. Thus, there is a need for device fabrication processes that selectively deposit material onto certain regions of heterogeneous substrates.

SUMMARY

A method of coating a structure is disclosed. Method steps include providing a structure having a first portion of a first material having a first surface and providing a second portion of a second material having a second surface, wherein a mask is provided over the first surface. Another step includes exposing the mask and the second surface to a solution comprising a polymer and a solvent, wherein the solution dewets from the mask and the polymer collects onto the second surface to form a polymer coating over the second surface without forming a polymer coating on the first surface. A finishing step may include removing the solvent and a remaining fraction of the polymer from the structure.

An additional embodiment of the method of selectively coating a structure is also disclosed. This additional embodiment includes providing a structure having a first portion of a first material with a first surface and providing a second portion of a second material with a second surface. A next step includes providing a solution made up of a polymer configured to coat the second surface, a coupling agent configured to couple with the first material and repel the polymer, and a solvent. A further step includes exposing the structure to the solution, wherein the coupling agent couples to the first material to form a mask from which the solution dewets and the polymer collects onto the second surface to form a polymer coating over the second surface without forming a polymer coating on the first surface. A finishing step may include removing remaining solution from the structure.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIGS. 6A, 6B, and 6C are plots showing that abrupt transitions are observed in the spin dewetting of polystyrene (PS) from OTS-$SiO_2$ as indicated by the film thickness dependence on spin speed, weight concentration, and molecular weight, respectively.

Figure 7A:
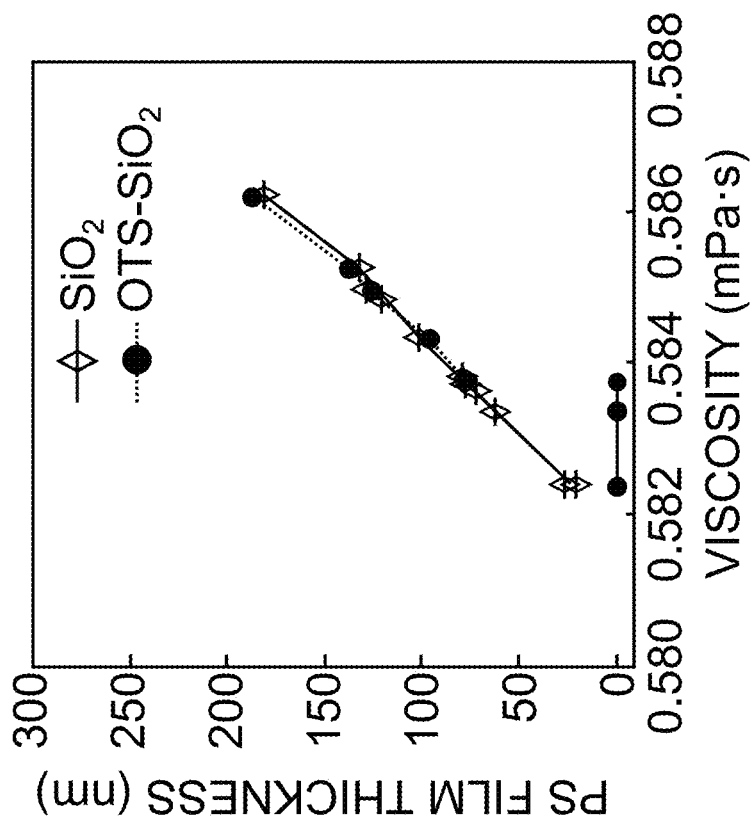
Figure 7B:
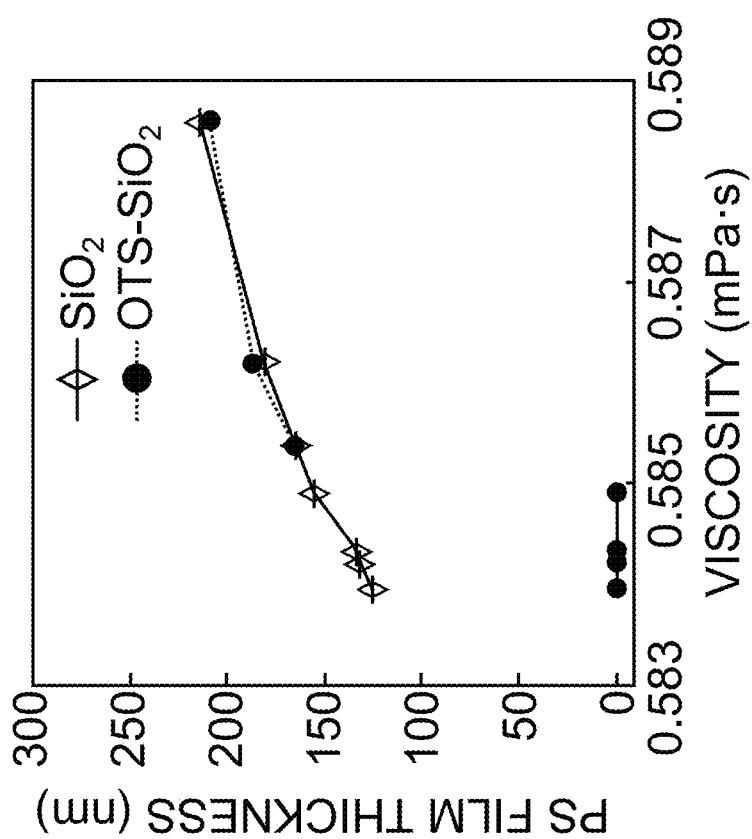

FIGS. 7A and 7B are plots showing that film thicknesses and dewetting conditions are comparable when varying molecular weight and weight concentration, respectively. PS=polystyrene.

Figure 8:
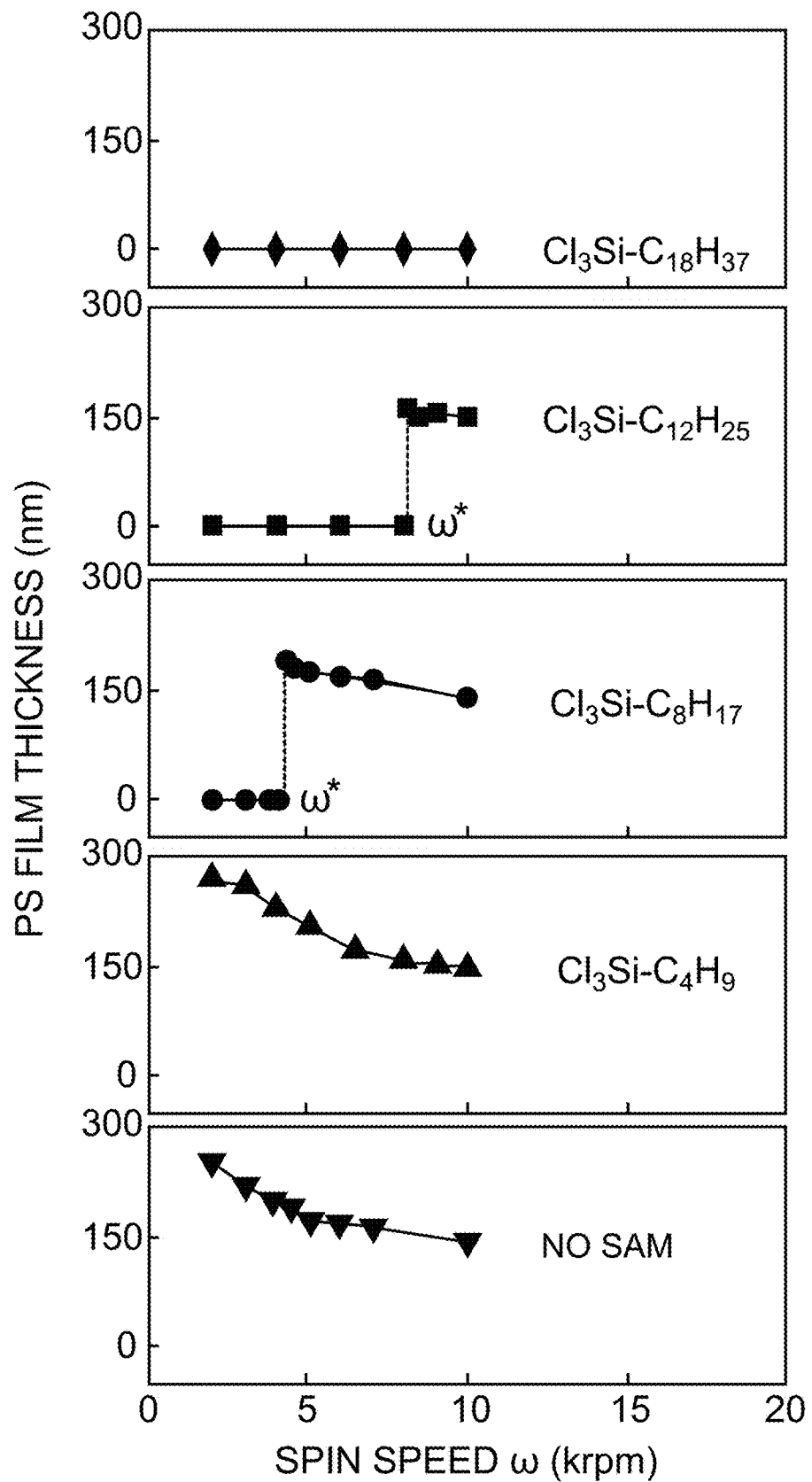

FIG. 8 is plots showing that SAM hydrophobicity is correlated with the range of spin speeds over which spin dewetting occurs and the location of an abrupt transition $\omega^*$. PS=polystyrene.

Figure 9:
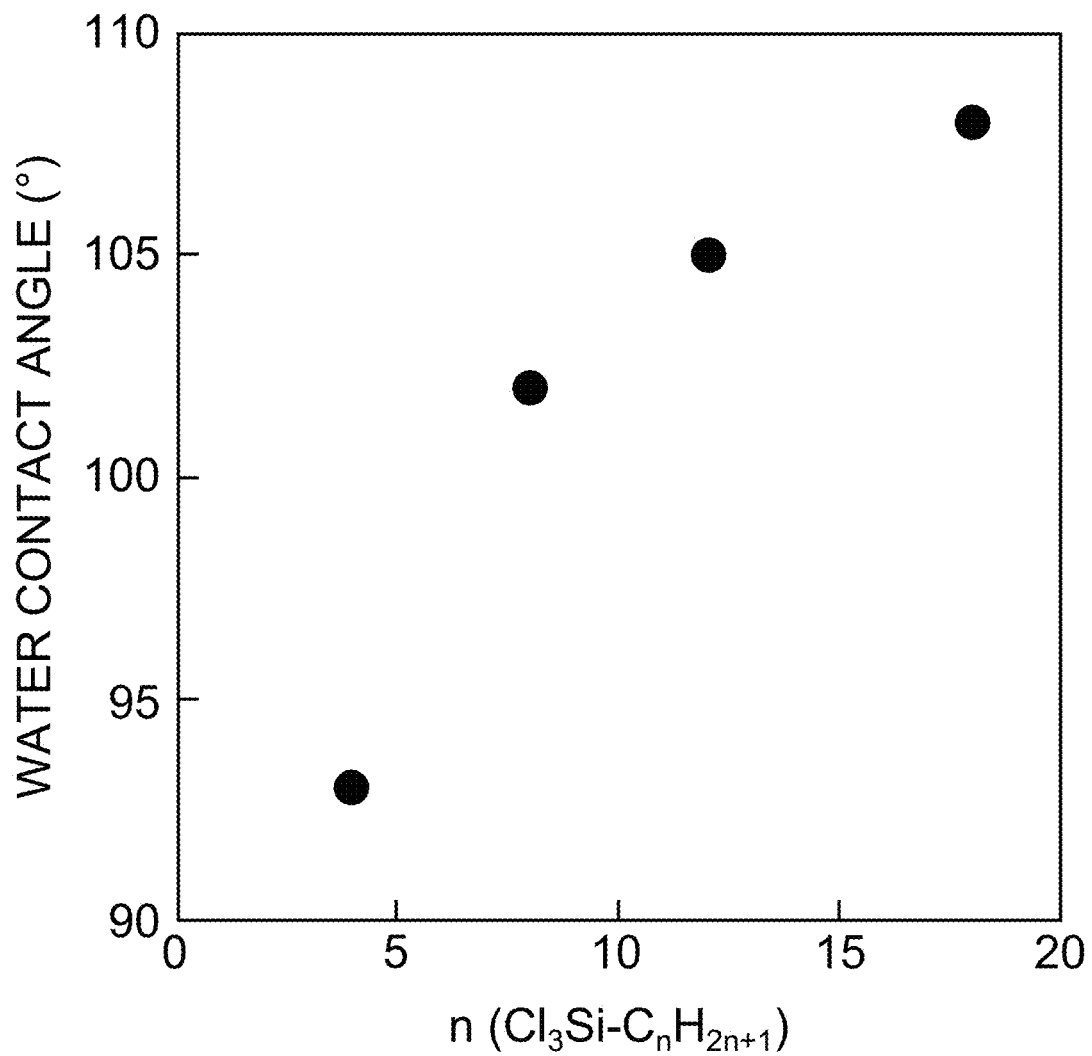

FIG. 9 is a plot showing that longer alkyl chains render the $SiO_2$ surface more hydrophobic.

FIGS. 10A, 10B, 10C, and 10D show step changes in polymer thickness for the glassy (at room temperature) polymers poly(tert-butyl acrylate), poly(acrylic acid), poly (vinyl chloride), and poly(methyl methacrylate), respectively.

Figure 10A:
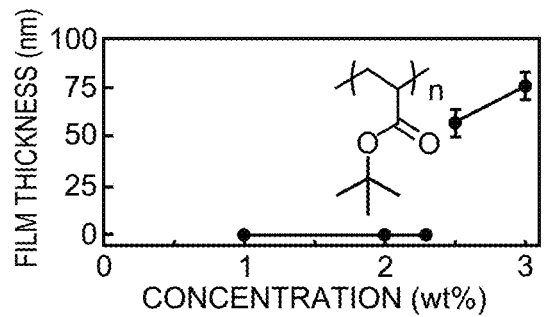
Figure 10B:
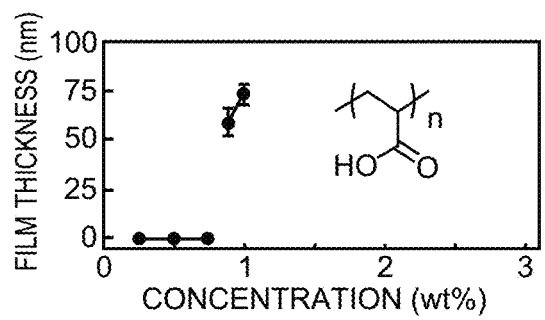
Figure 10C:
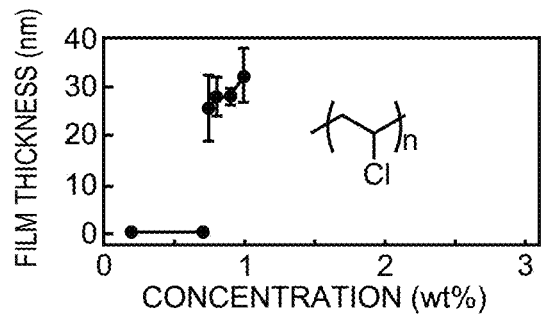
Figure 10D:
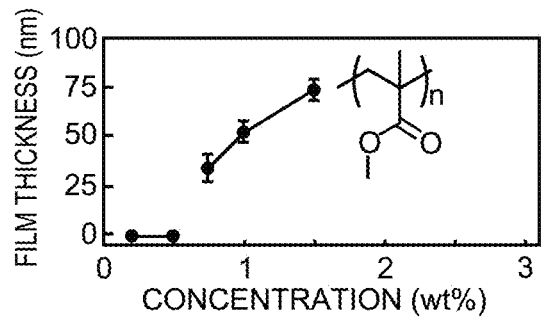
Figure 10E:
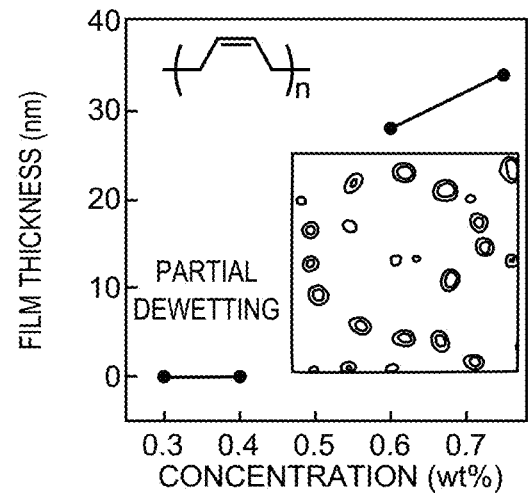
Figure 10F:
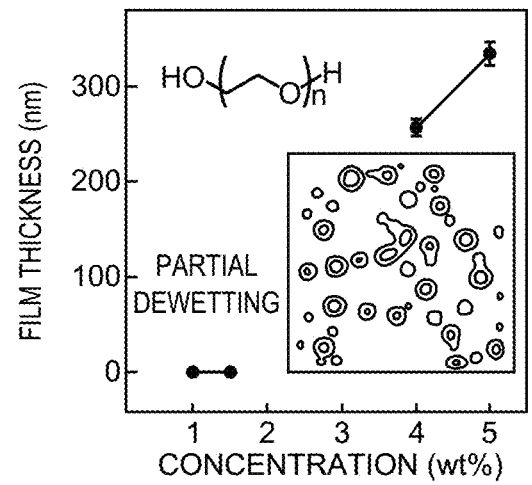

FIGS. 10E and 10F show that rubbery polymers polybutadiene and poly(ethylene oxide) exhibit a region between wetting and dewetting where droplets form, as evidenced by line drawings of optical micrographs (12 μm×12 μm).

Figure 11A:
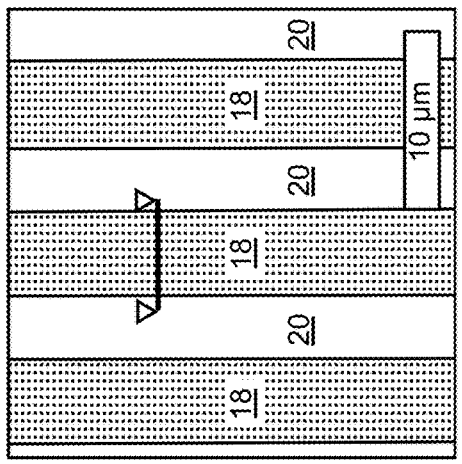
Figure 11B:
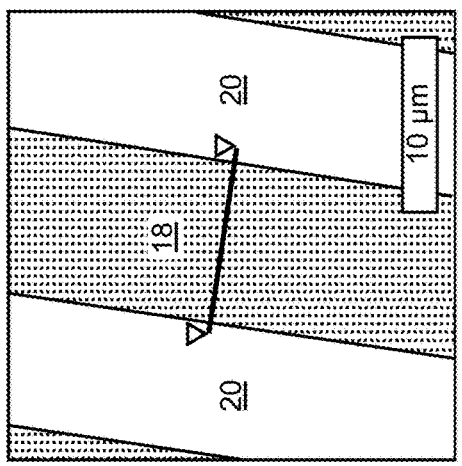
Figure 11C:
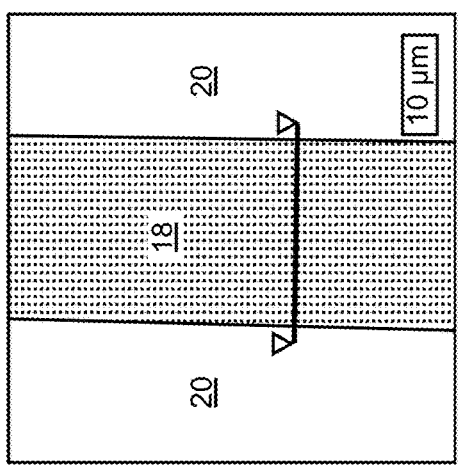

FIGS. 11A, 11B, and 11C are line drawings of atomic force microscopy (AFM) images of copper (Cu)/OTS-$SiO_2$ with different pre-pattern pitches: 40 μm, 20 μm, and 10 μm, respectively.

Figure 11D:
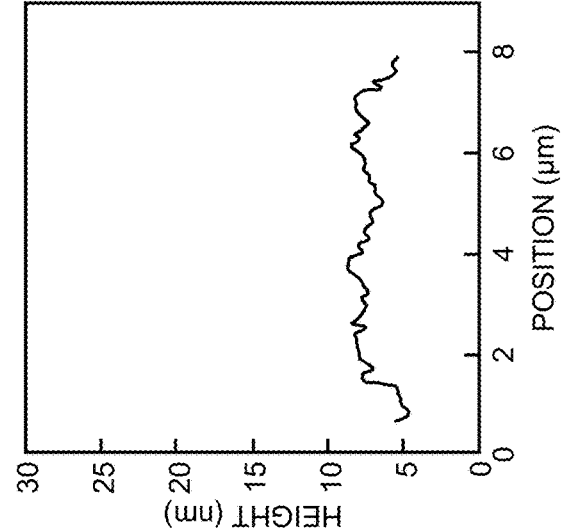
Figure 11E:
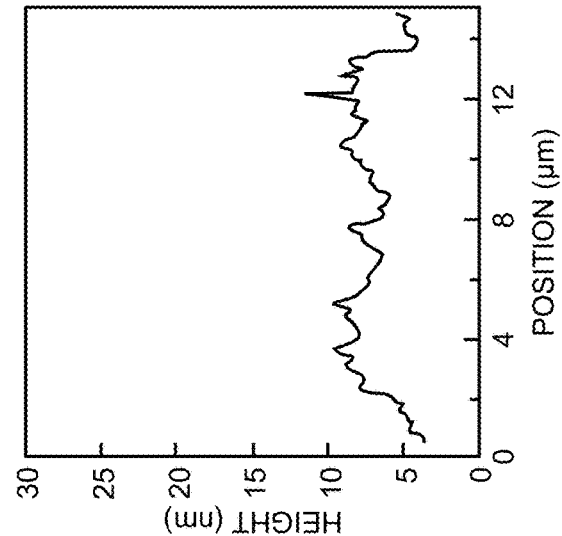
Figure 11F:
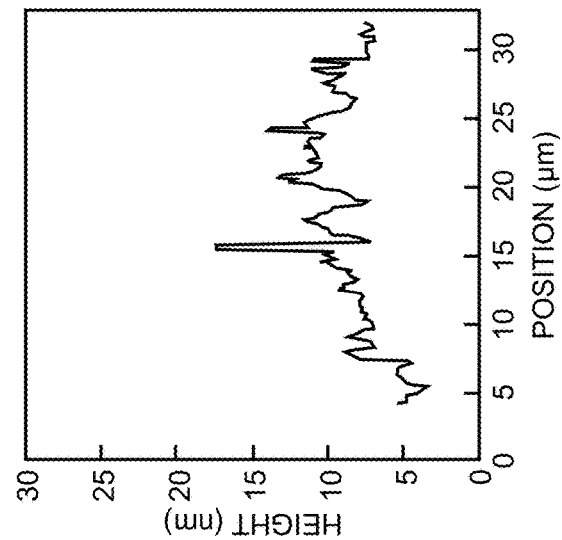

FIGS. 11D, 11E, and 11F are the corresponding height profiles of FIGS. 11A, 11B, and 11C, respectively.

Figure 12A:
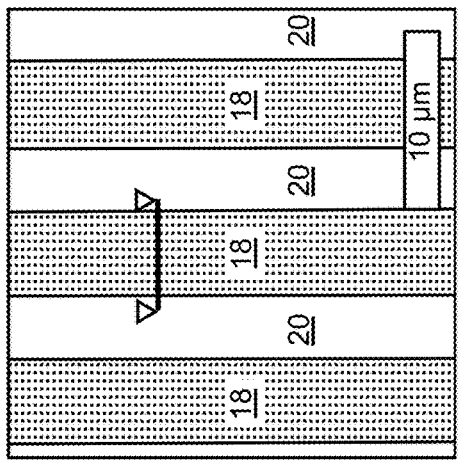
Figure 12B:
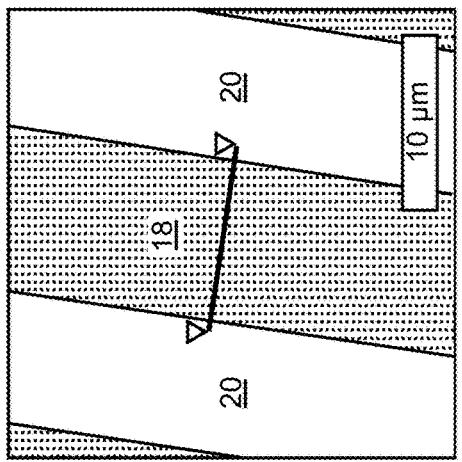
Figure 12C:
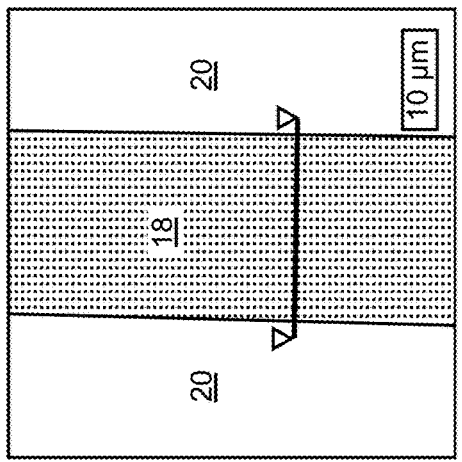

FIGS. 12A, 12B, and 12C are line drawings of AFM images of TiN/OTS-SiO$_2$ with different pre-pattern pitches: 40 µm, 20 µm, and 10 µm, respectively.

Figure 12D:
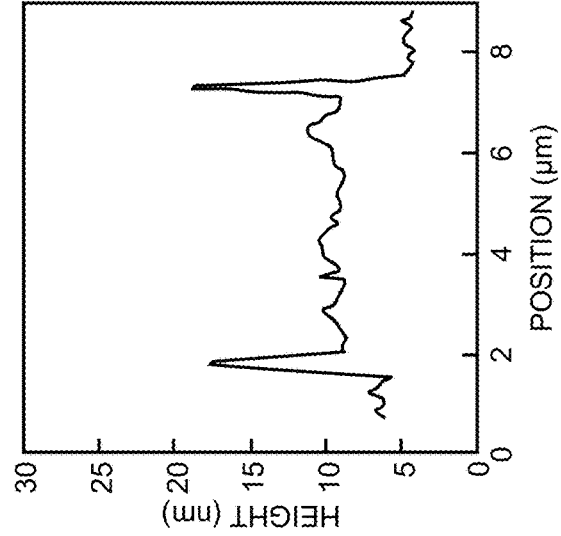
Figure 12E:
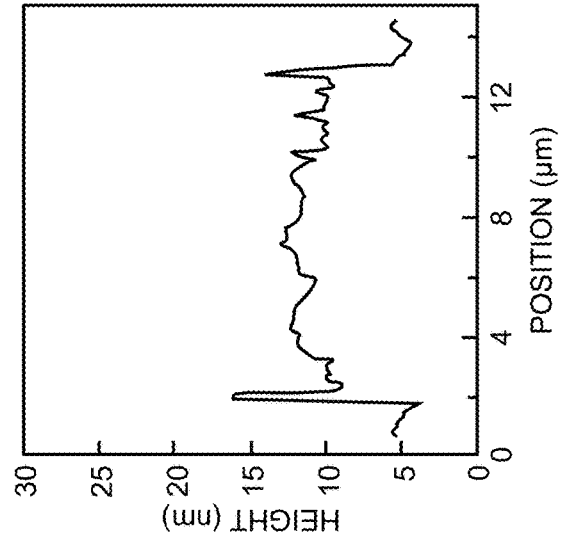
Figure 12F:
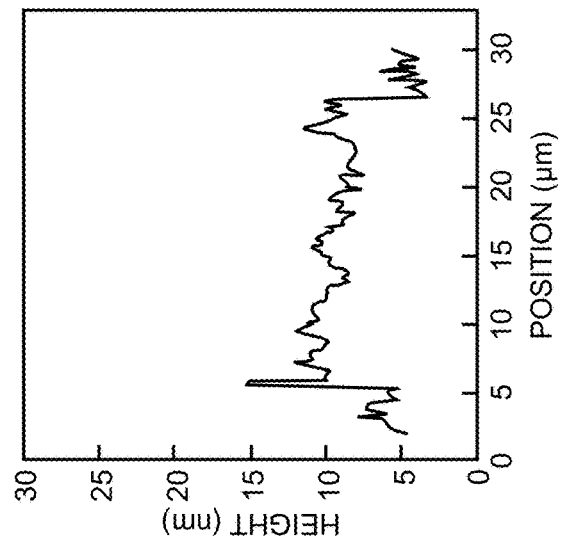

FIGS. 12D, 12E, and 12F are the corresponding height profiles of FIGS. 12A, 12B, and 12C, respectively.

Figure 13:
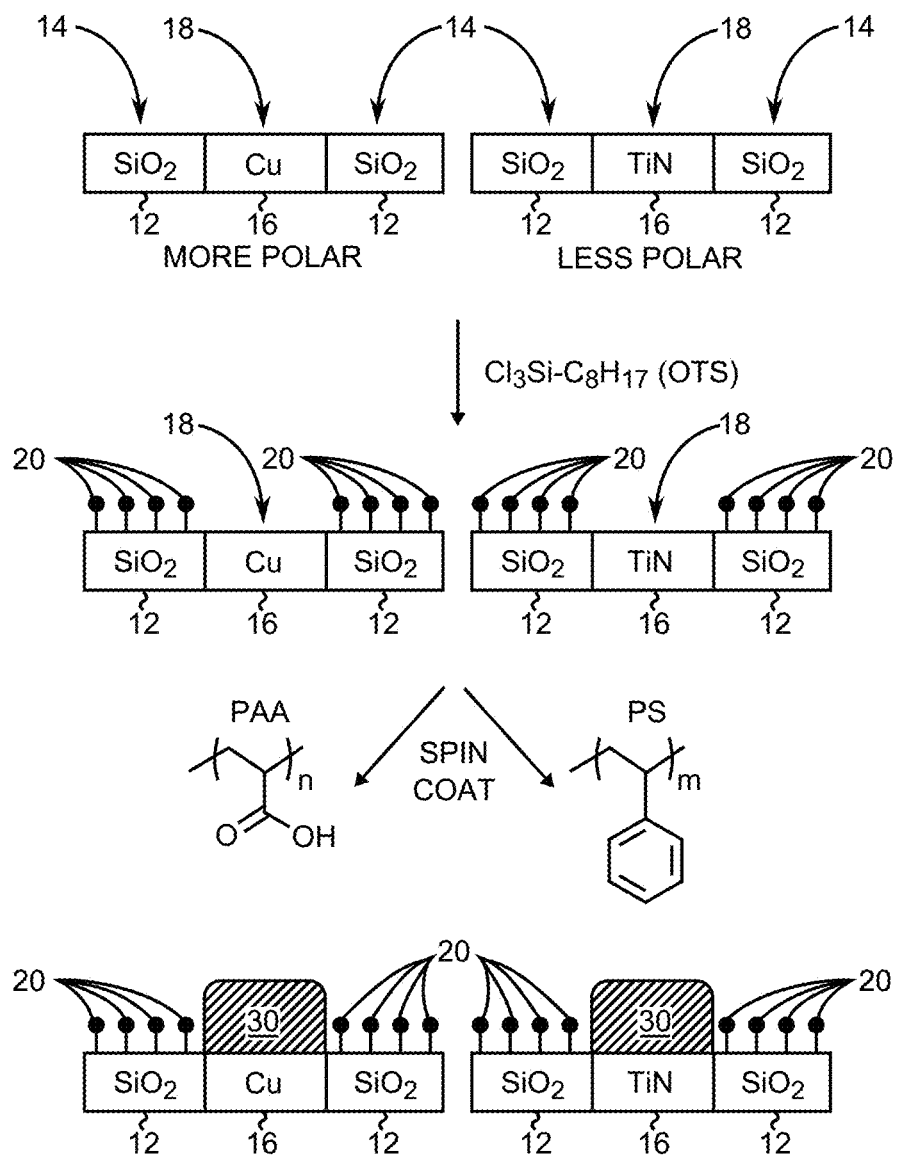

FIG. 13 is a diagram showing spin dewetting on heterogeneous surfaces in which the preferential functionalization of SiO$_2$ with a hydrophobic alkylsilane induces selective polymer deposition on the opposing material during spin coating. PS=polystyrene; PAA=poly(acrylic acid).

FIGS. 14A and 14B are line drawings of optical micrographs of spun cast poly(acrylic acid) films on Cu/SiO$_2$ substrates treated with OTS for t=30 s<$t_c$=1 min and for t≥$t_c$, respectively.

FIGS. 14C and 14D are line drawings of optical micrographs of spun cast polystyrene films on TiN/SiO$_2$ substrates treated with OTS for t=30 s<$t_c$=1 min and for t≥$t_c$, respectively.

Figures 15A, 15B:
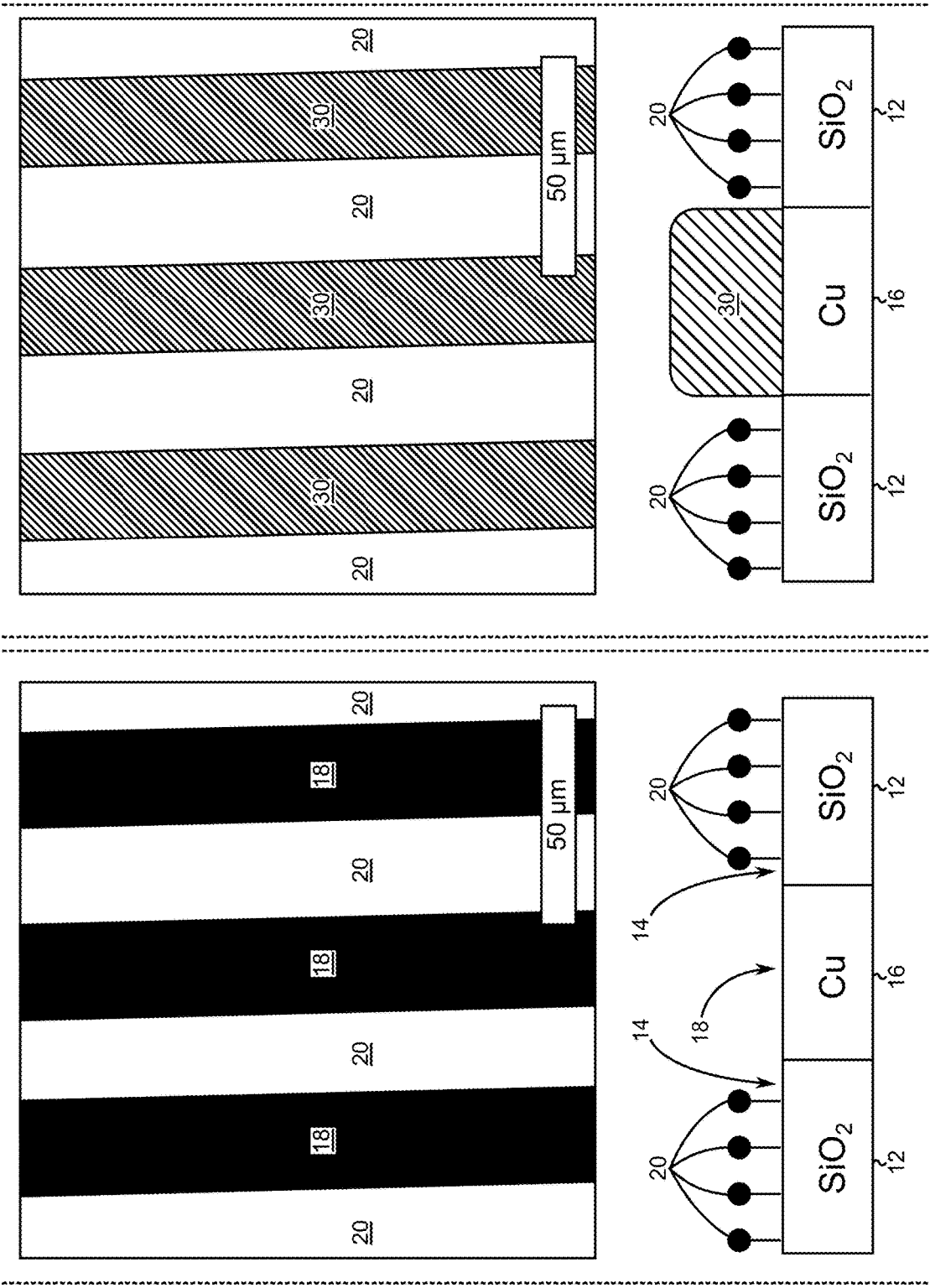

FIGS. 15A and 15B are diagrams showing that secondary ion mass spectrometry (SIMS) chemical mapping reveals spin dewet poly(acrylic acid) on Cu/OTS-SiO$_2$ exclusively covers copper: Cu/OTS-SiO$_2$ before polymer deposition, and poly(acrylic acid) on Cu/OTS-SiO$_2$, respectively.

FIG. 16 shows that Cu/SiO$_2$ patterns made by photolithography exhibit no carbon signals as evidenced by SIMS chemical mapping.

FIGS. 17A, 17B, and 17C show SIMS chemical mapping images that reveal spin dewetting of polystyrene on TiN/OTS-SiO$_2$ exclusively covers TiN: TiN/SiO$_2$ as-fabricated by photolithography; TiN/OTS-SiO$_2$ after SAM deposition but before spin dewetting; and polystyrene on TiN/OTS-SiO$_2$ after spin dewetting, respectively.

Figures 18A, 18B, 18C:
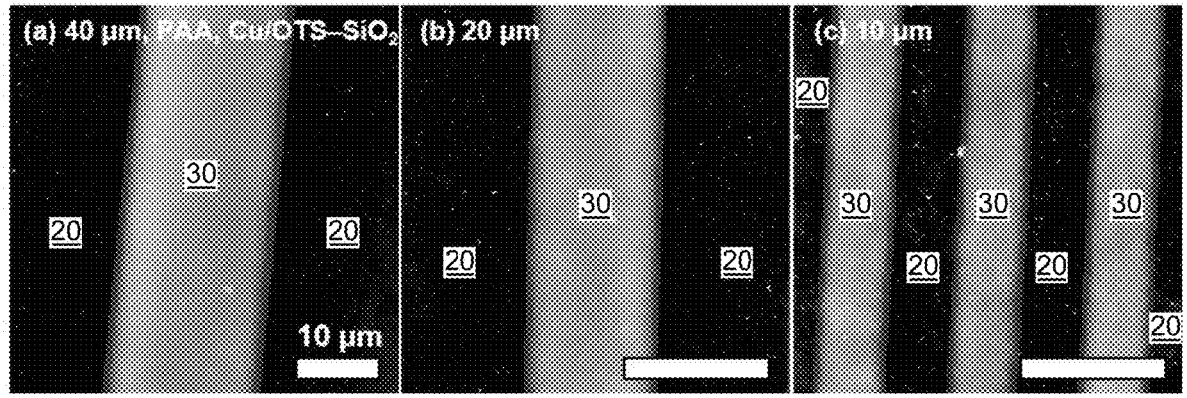

FIGS. 18A, 18B, and 18C are AFM images of poly (acrylic acid) on Cu/OTS-SiO$_2$ with different underlying pre-pattern pitches: 40 µm, 20 µm, and µm, respectively. All scale bars are 10 µm.

Figures 19A, 19B, 19C:
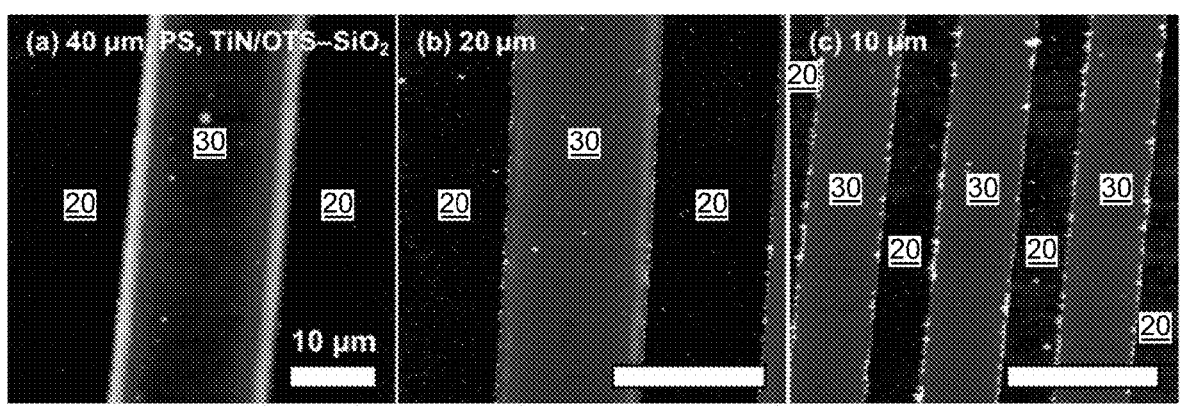

FIGS. 19A, 19B, and 19C are AFM images showing that polystyrene films on TiN/OTS-SiO$_2$ have better fidelity than those on Cu/OTS-SiO$_2$: polystyrene fully covers TiN with different underlying pre-pattern pitches: 40 µm, µm, and 10 µm, respectively.

Figure 20A:
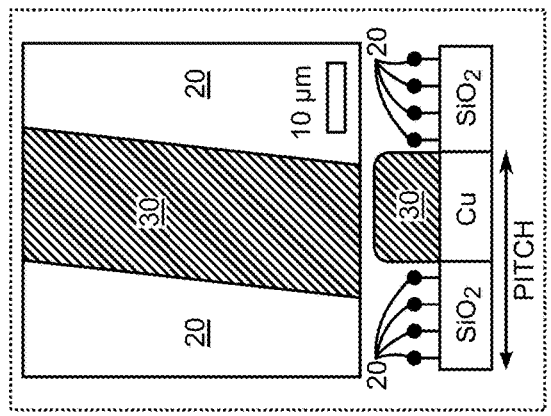
Figure 20B:
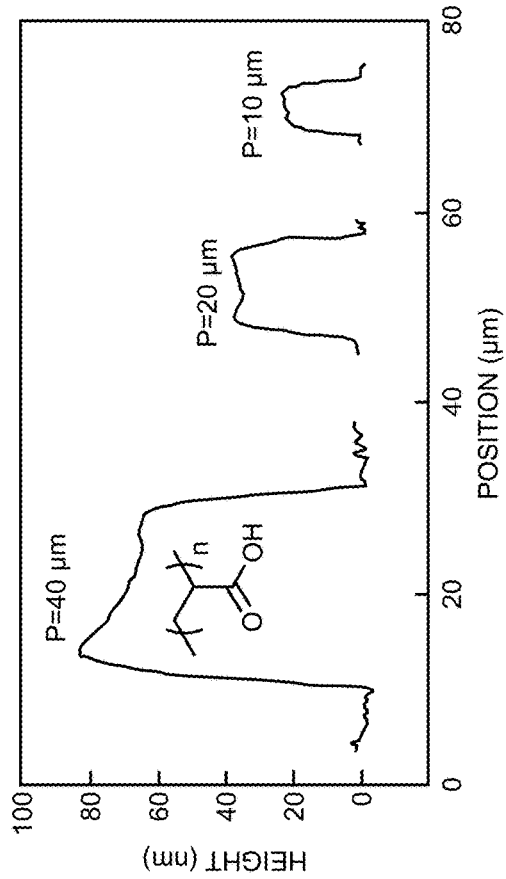

FIGS. 20A and 20B are a line drawing of an AFM image of poly(acrylic acid) on Cu/OTS-SiO$_2$ (40 µm) and height profiles at three different pitches, respectively.

Figure 20C:
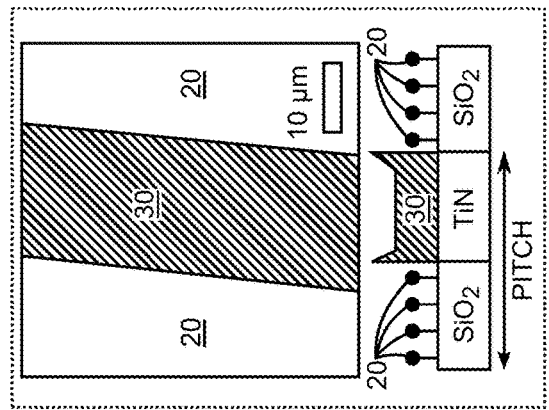
Figure 20D:
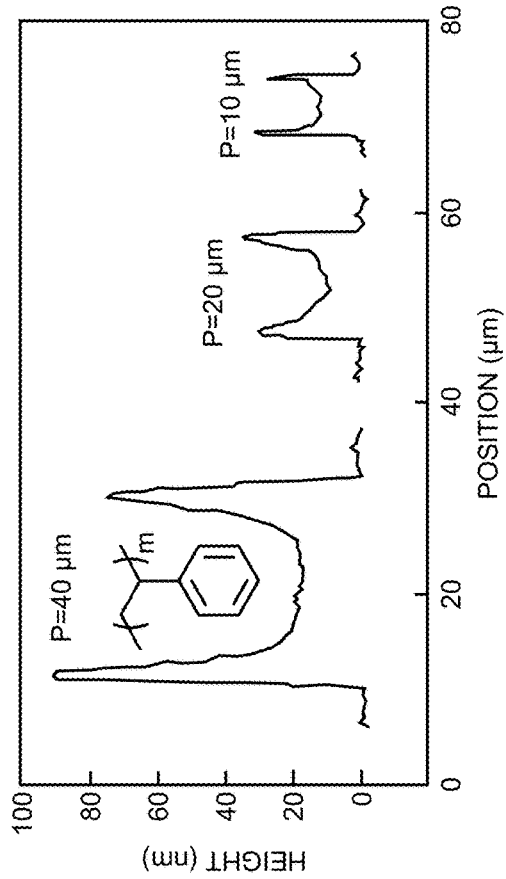

FIGS. 20C and 20D are a line drawing of an AFM image of polystyrene on TiN/OTS-SiO$_2$ and height profiles at three different pitches, respectively.

Figure 21B:
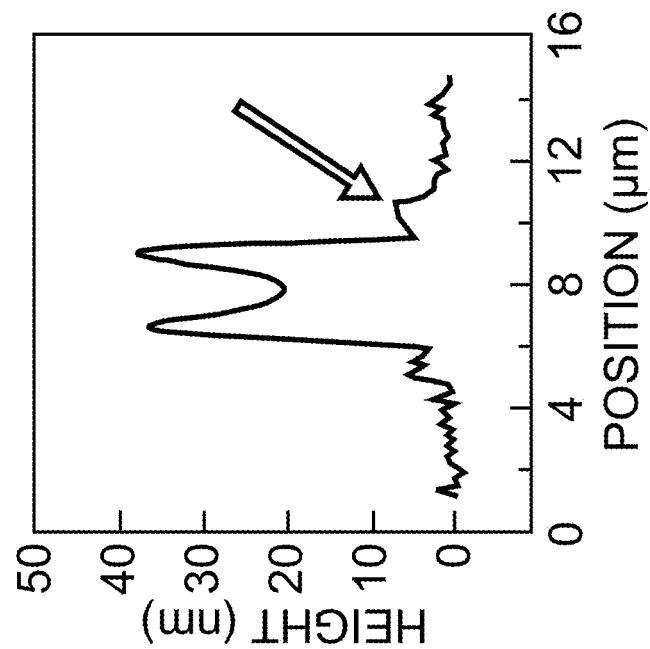
Figure 21A:
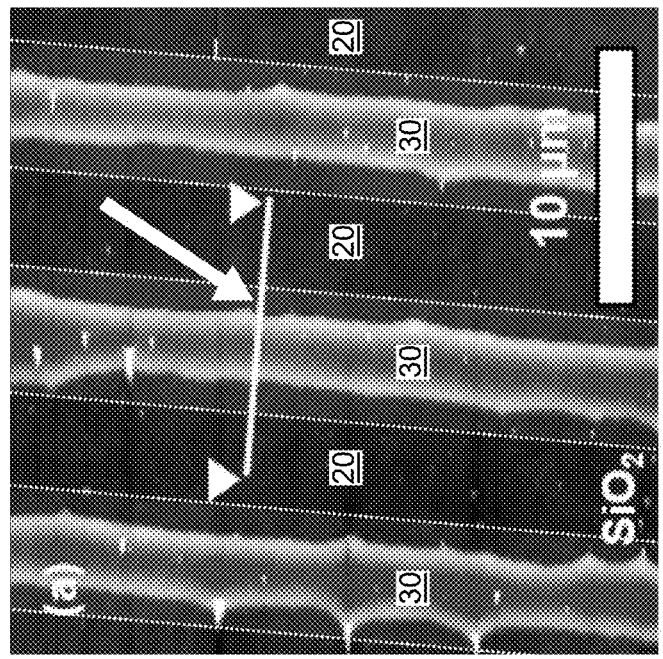

FIG. 21A is an AFM image showing that polystyrene films on Cu/OTS-SiO$_2$ exhibit U shapes with worse coverage than those on TiN/OTS-SiO$_2$, as shown in FIG. 19C, under the same spin dewetting processing conditions.

FIG. 21B shows a height profile of the line cut; an arrow points to the edges of a copper stripe, which are not covered by polymer.

Figure 22B:
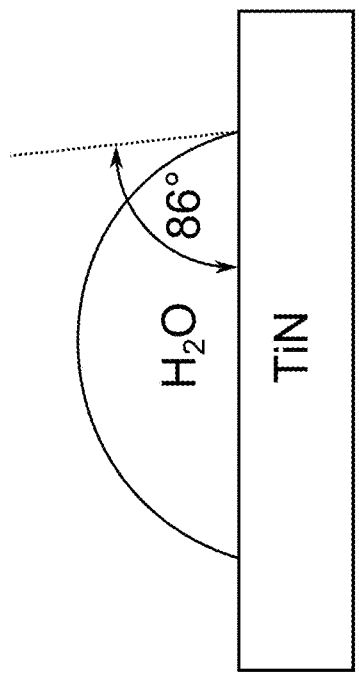
Figure 22A:
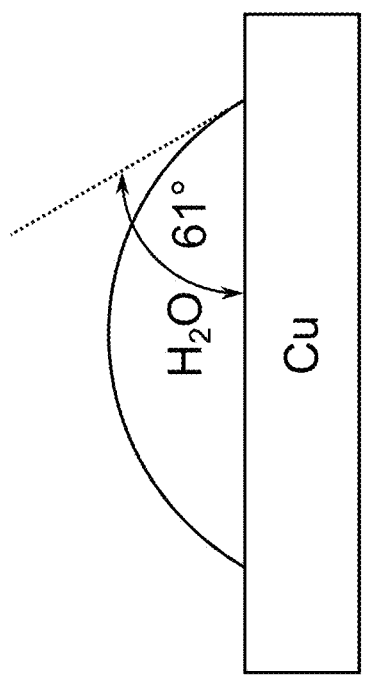

FIGS. 22A and 22B show that water contact angles of copper and TiN, respectively, suggest a difference in native surface polarity.

Figure 23B:
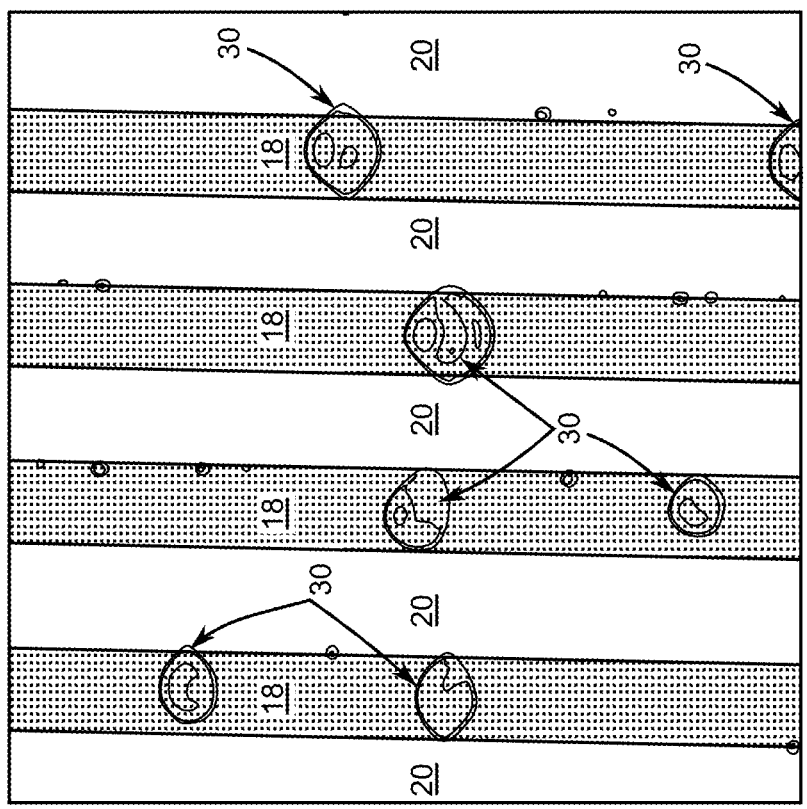
Figure 23A:
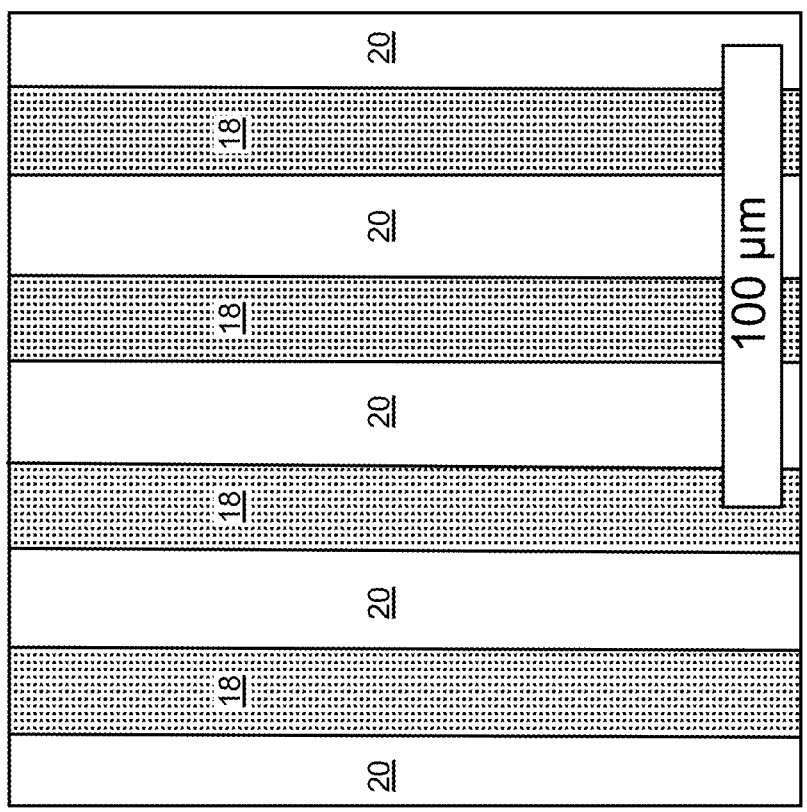

FIGS. 23A and 23B are line drawings of optical images showing that poly(acrylic acid) completely dewets from TiN/OTS-SiO$_2$: TiN/OTS-SiO$_2$ and poly(acrylic acid) spin-dewet on TiN/OTS-SiO$_2$, respectively.

Figure 24A:
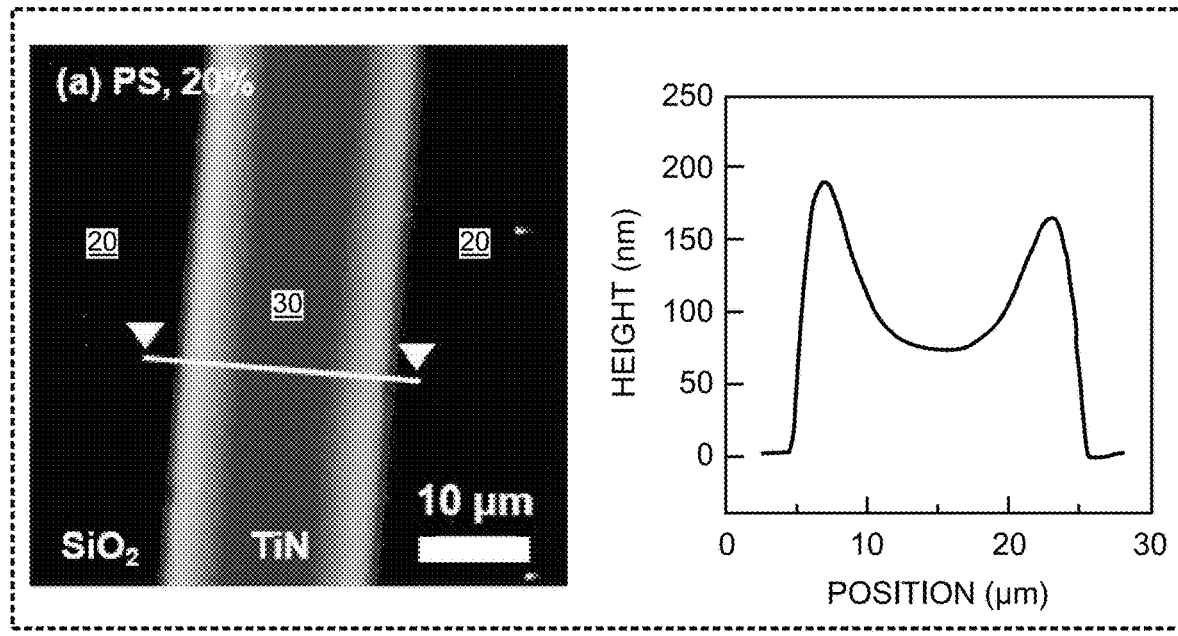

FIG. 24A shows increasing of the polystyrene (PS4) solution concentration to 20 wt % (c.f., 5 wt %, shown in FIGS. 20C and 20D).

Figure 24B:
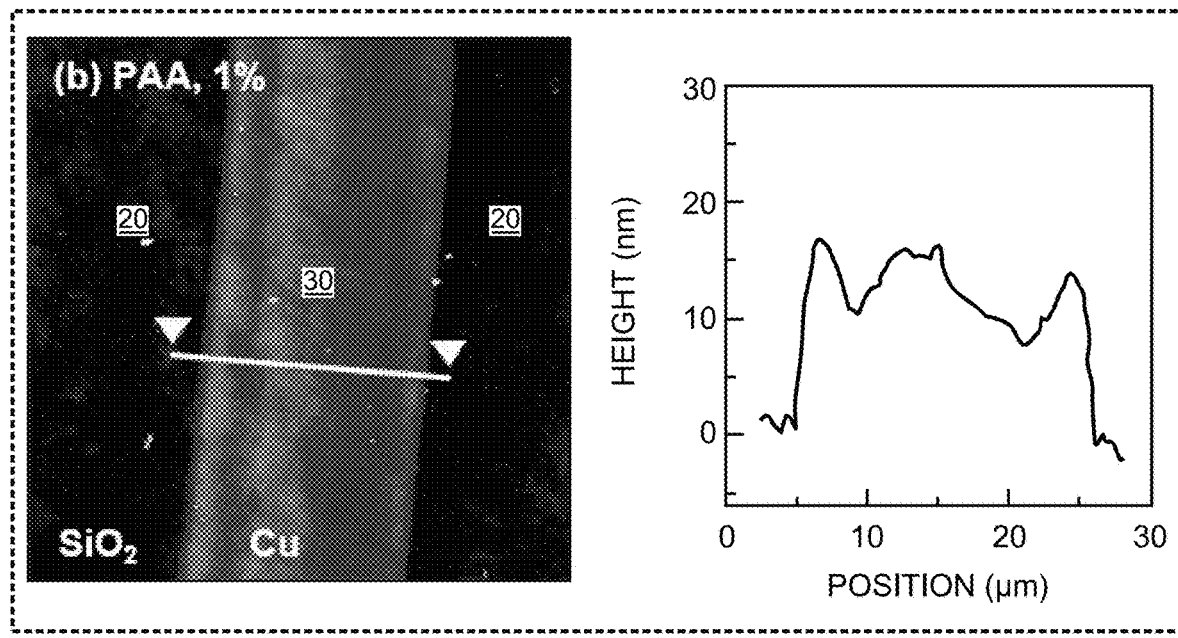

FIG. 24B shows decreasing of the poly(acrylic acid) (PAA1) solution concentration to 1 wt % (compare with 5 wt %, FIGS. 20A and 20B).

Figure 25A:
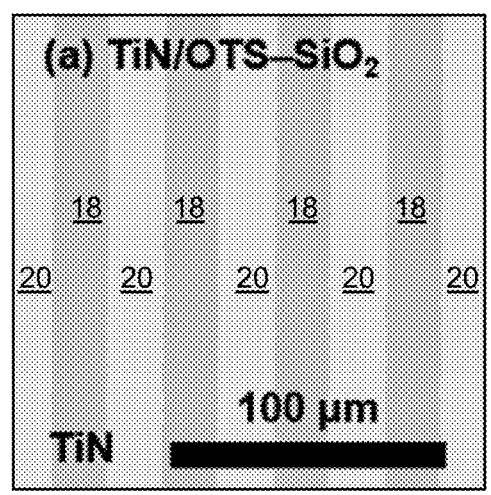
Figure 25B:
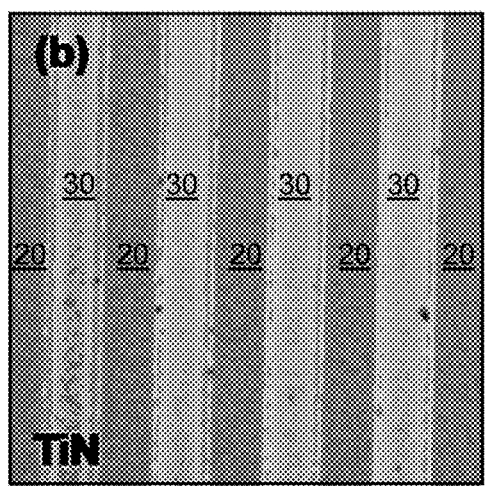
Figure 25C:
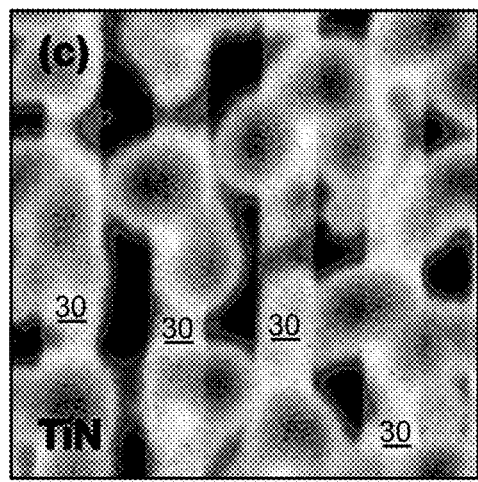

FIGS. 25A, 25B, and 25C are optical micrographs collected for TiN/OTS-SiO$_2$ prior to spin coating, polystyrene confined over TiN via spin dewetting, and a continuous but rough film of polystyrene formed via spin wetting using a different casting solvent, respectively.

Figure 25D:
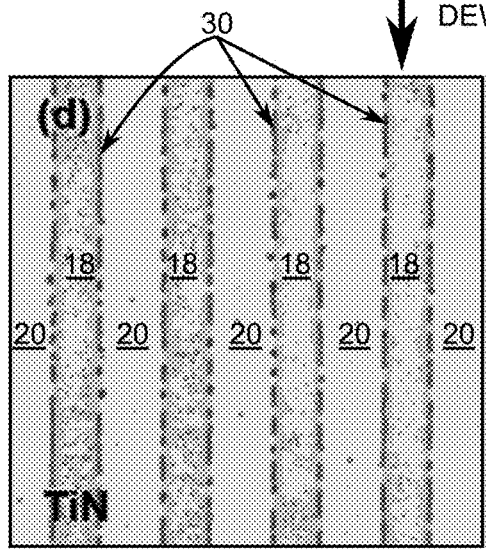
Figure 25E:
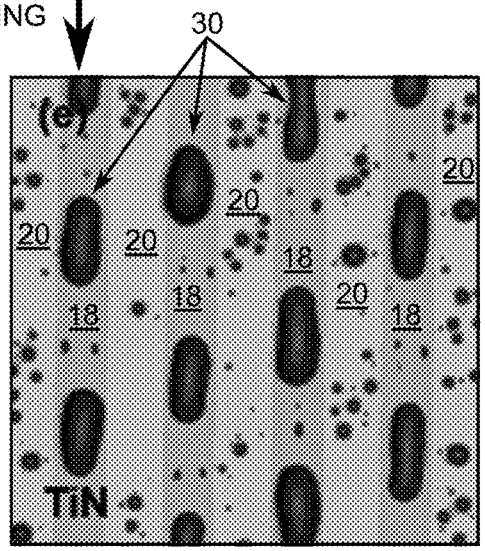

FIGS. 25D and 25E are optical micrographs showing thermal dewetting at 170° C. for 1 hr of the spin dewetting and spin wetting films, respectively.

Figure 26B:
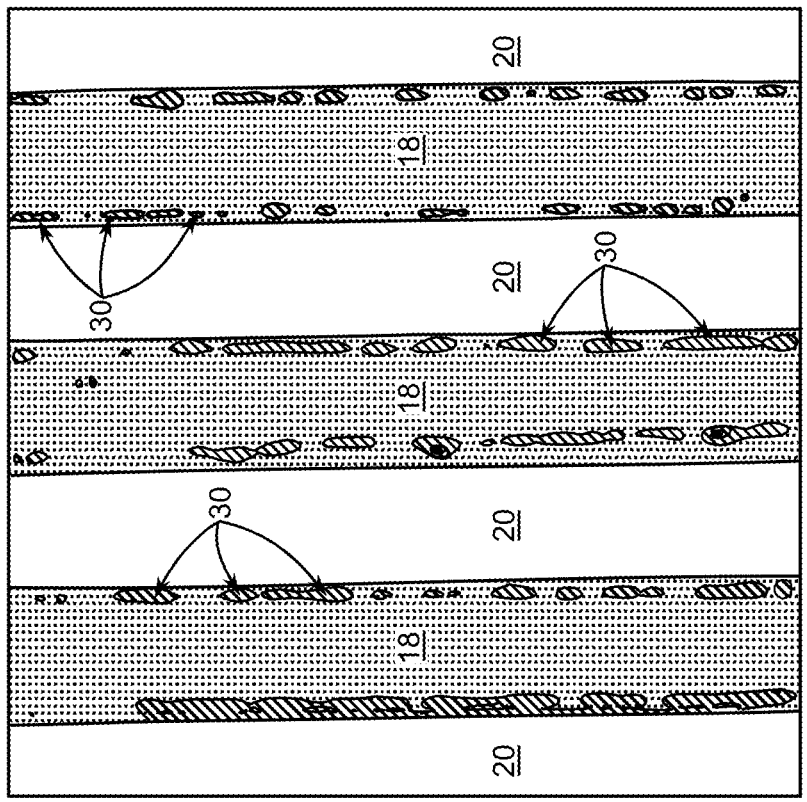
Figure 26A:
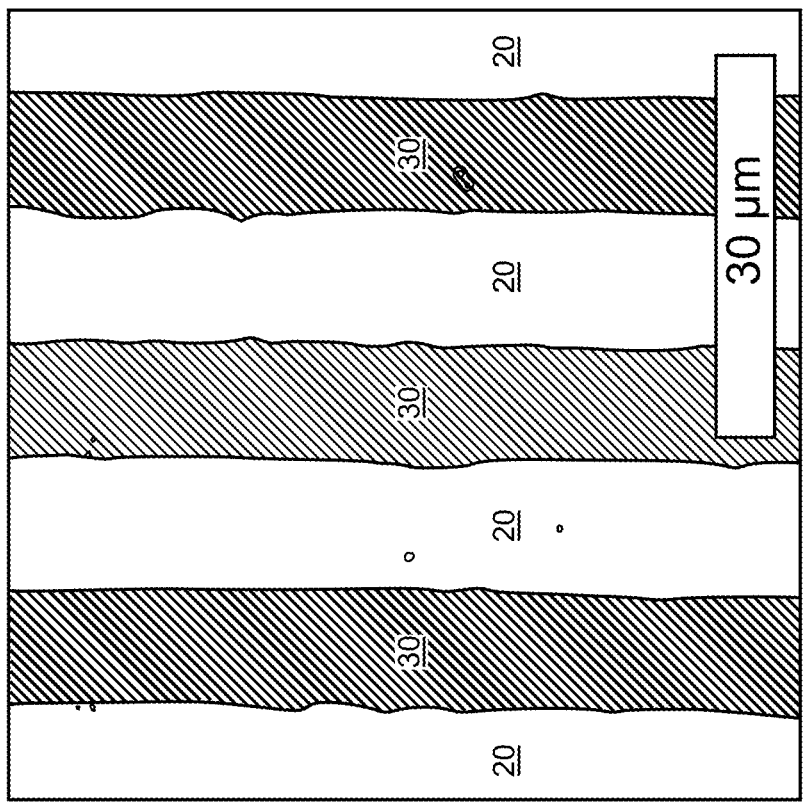

FIGS. 26A and 26B are optical micrographs showing that polystyrene (PS4) dewets from copper upon thermal annealing: of an as-cast polystyrene film on Cu/OTS-SiO$_2$, and after annealing at 170° C. for 1 hr, respectively.

Figures 27A, 27B, 27C:
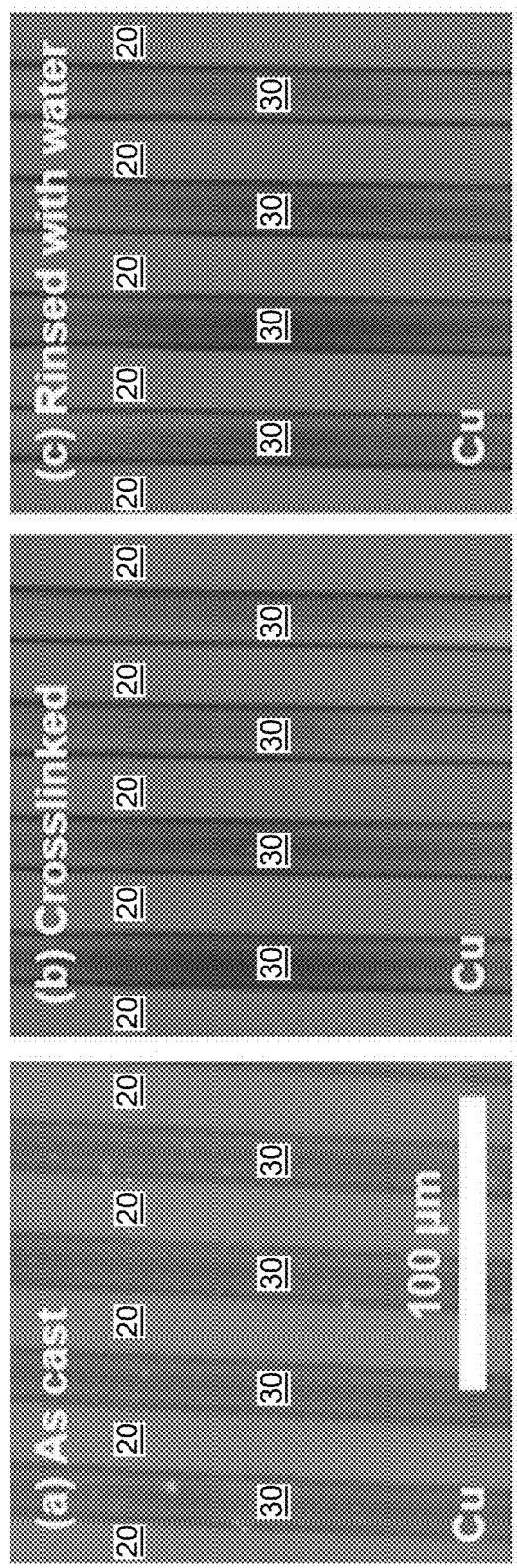

FIGS. 27A, 27B, and 27C are optical images showing that poly(acrylic acid) (PAA1) crosslinks at 240° C. on Cu/OTS-SiO$_2$ and thereafter becomes insoluble in water: as-spin-dewet poly(acrylic acid), crosslinked at 240° C. for 1 hr, and rinsed with water, respectively.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

An abundance of thin-film patterning techniques—for example, optical lithography, imprint lithography, and microcontact printing-underpin many types of contemporary technology ranging from microelectronics to tailored biosurfaces. Frequently, three-dimensional design targets require iterative thin-film processing to create structures that cannot be formed in a single step. The added complexity of overlay and alignment can create significant practical difficulties that amplify economic costs. In principle, these challenges could be alleviated by self-aligned patterning, which uses existing chemical and/or topographic features to template subsequent layers.

A variety of strategies have been developed to achieve self-aligned patterning of inorganic and organic materials in thin films. Each strategy involves manipulating selectivity during the deposition step by blocking or promoting film formation via interfacial engineering. One common approach leverages the preferential attachment of self-assembled monolayers (SAMs) to spatially control nucleation, growth, and/or wettability. For example, alkylphosphonic acid SAMs have been exploited to protect copper and induce area-selective atomic layer deposition of inorganic oxides only on silicon dioxide ($SiO_2$). SAMs can similarly influence the spatial distribution of polymer films through phase separation, self-assembly, localized brush growth, and thermal dewetting. However, unlike inorganics, the majority of past work on SAM-directed polymer thin-film patterning placed SAMs on flat, homogeneous substrates, for example, with microcontact printing. Developing similar capabilities to selectively pattern polymer thin films on heterogeneous surfaces, such as metal/dielectric surfaces, would provide fundamental insight that might someday be useful in technological applications.

The present disclosure relates to a technique known as spin dewetting, which results in the local segregation of polymers during spin coating and requires no post-processing or additional steps to generate patterns. The selective deposition of polymer thin films can be achieved via spin coating by manipulating interfacial interactions. While this spin dewetting approach sometimes generates spatial localization on topographic and chemical patterns, the connection between material selection, process parameters, and resulting film characteristics remains poorly understood. The present disclosure demonstrates that accurate control over these parameters allows incomplete trichlorosilane SAMs to induce spin dewetting on both homogeneous (silicon dioxide) and heterogeneous (copper/silicon dioxide or titanium nitride/silicon dioxide) surfaces. Glassy polymers undergo a sharp transition from uniform wetting to complete dewetting depending on spin speed, solution concentration, polymer molecular weight, and SAM chemistry. Under optimal conditions, spin dewetting on line-space patterns results in the selective deposition of polymer over regions not functionalized with SAM. The insights described in the present disclosure clarify the importance of different variables involved in spin dewetting and provide access to a versatile strategy for patterning polymeric thin films.

Previously, the simplicity of spin dewetting in comparison with more complex patterning methodologies has been highlighted. The use of topographic poly(dimethylsiloxane) substrates was explored and demonstrated an impressive array of resulting polymer structures depending on pre-pattern dimensions and coating conditions. In addition, block copolymers were selectively deposited on patterned surfaces via careful temperature control. Despite promise, there still remains significant uncertainty surrounding the design rules that govern spin dewetting as a function of material selection and processing. The present disclosure systematically investigates SAM-promoted spin dewetting using homogeneous ($SiO_2$) and heterogeneous (copper/silicon dioxide, $Cu/SiO_2$; titanium nitride/silicon dioxide, $TiN/SiO_2$) substrates that are relevant to the microelectronics industry. Significantly, incomplete SAM layers are sufficient to induce spin dewetting, resulting in selective polymer deposition on copper and TiN lines under optimal conditions.

Figure 1:
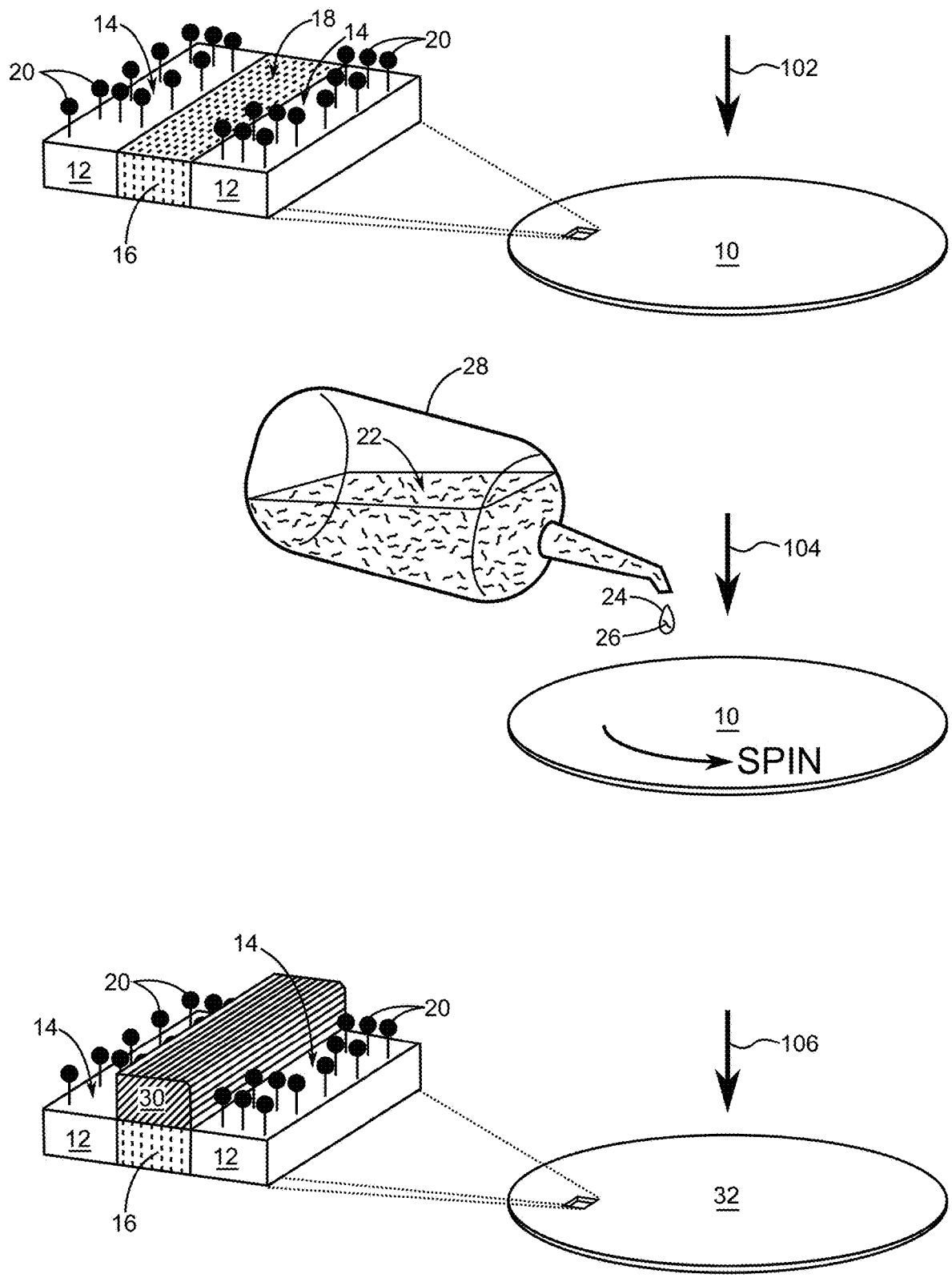
FIG. 1 is a generalized diagram of an embodiment of a method for selectively coating a structure in accordance with the present disclosure.

FIG. 1 is a generalized diagram of an embodiment of a method for selectively coating a structure 10 in accordance with the present disclosure. A first step involves providing the structure 10, which as shown in an enlarged cutout, has a first portion of a first material 12 with a first surface 14 (step 102). The structure 10 also has a second portion of a second material 16 having a second surface 18. A mask 20 is provided over the first surface 14. Typically, a preliminary step involves growing the mask 20 onto the first surface 14. However, the preliminary step may occur outside a continuous process flow. For example, the preliminary step of growing the mask 20 may occur offsite and may then be delivered on-site for further processing that begins with step 102.

A second step involves exposing the mask 20 and the second surface 18 to a solution 22 that is made up of a solvent 24 and a polymer 26 (step 104). In the exemplary embodiment of FIG. 1, the solution 22 is depicted as being dispensed from a dispenser 28 onto the structure 10. The structure 10 is then set spinning as indicated by a curved arrow. While the structure 10 is spinning, the solution 22 dewets from the mask 20 and the polymer 26 collects onto the second surface 18 to form a polymer coating 30 over the second surface 18 without forming a polymer coating over the first surface 14. A third step involves allowing the solvent 24 to evaporate from the structure 10, leaving the polymer coating 30 to harden (step 106). This step may include rinsing the structure 10 with a liquid such as water after the polymer coating 30 hardens. Once the polymer hardens, the structure 10 becomes selectively coated structure 32.

Figure 2:
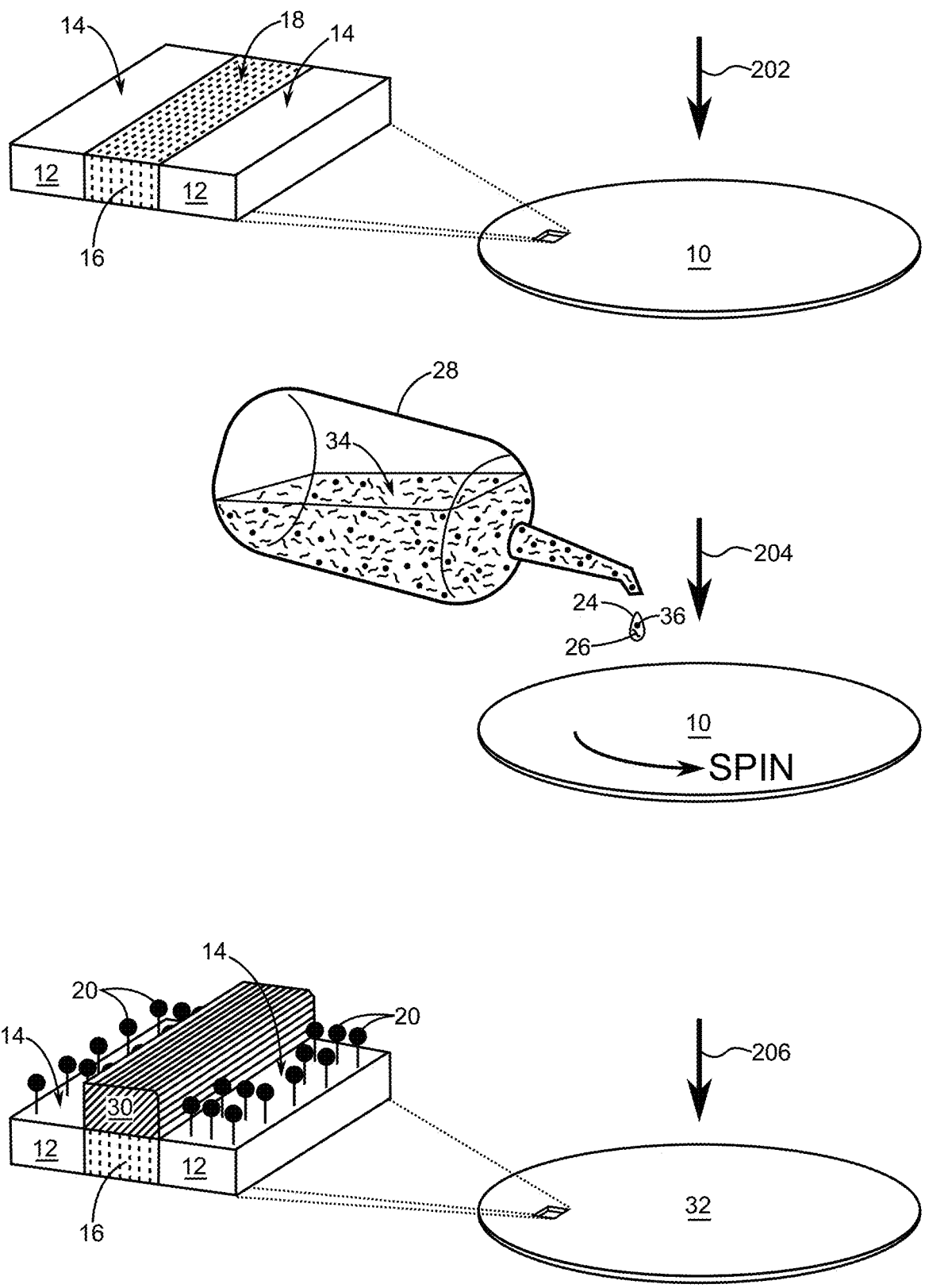
FIG. 2 is a generalized diagram of another embodiment of a method for selectively coating a structure in accordance with the present disclosure.

FIG. 2 is a generalized diagram of another embodiment of a method for selectively coating a structure 10 in accordance with the present disclosure. In this particular embodiment, the structure 10 is originally provided without the mask 20

(step 202). Instead, a second step involves exposing the first surface 14 and the second surface 18 to a solution 34 that is made up of the solvent 24, the polymer 26, and a coupling agent 36 (step 204). Once the polymer hardens, the structure 10 becomes selectively coated structure 32.

In the exemplary embodiment of FIG. 2, the solution 34 is depicted as being dispensed from the dispenser 28 onto the structure 10. The structure is then set spinning as indicated by the curved arrow. While the structure 10 is spinning, the coupling agent 36 couples to the first material 12 to form the mask from which the solution 34 dewets from the mask 20, and the polymer 26 collects onto the second surface 18 to form the polymer coating 30 over the second surface 18 without forming a polymer coating over the first surface 14. A third step involves allowing the solvent 24 to evaporate from the structure 10 leaving the polymer coating 30 to harden (step 206). As with the previous embodiment, this step may include rinsing the structure 10 with a liquid such as water after the polymer coating 30 hardens.

In the exemplary embodiments of FIG. 1 and FIG. 2, the first material 12 is a dielectric and the second material 16 is an electrical conductor or vice versa. The mask 20 may be a self-assembled monolayer, and the polymer coating may be polymers typically used in semiconductor manufacturing. The following sections disclose detailed embodiments in accordance with the present disclosure.

Materials and Detailed Methods

Materials.

Anhydrous toluene, dioxane, methanol, octyltrichlorosilane (OTS), and octadecyltrichlorosilane (ODTS) were purchased from Sigma-Aldrich and were used without further purification. Butyltrichlorosilane (BTS) and dodecyltrichlorosilane (DDTS) were purchased from Gelest, Inc., and were used without further purification. Copper and TiN stripes on $SiO_2$ wafers were patterned by standard photolithography using lift-off. Table 1 provides characterization data of the polymers used in the present disclosure:

TABLE 1

| Polymer | Sample ID | $M_n$ (kDa) | Ð | Source |
|---|---|---|---|---|
| Polystyrene | PS1 | 2.8 | 1.05 | Polymer Source |
| | PS2 | 8.0 | 1.10 | Polymer Source |
| | PS3 | 10.2 | 1.05 | Polymer Source |
| | PS4 | 21.5 | 1.05 | Polymer Source |
| | PS5 | 35.0 | 1.10 | Sigma-Aldrich |
| | PS6 | 51.0 | 1.10 | Polymer Source |
| | PS7 | 87.2 | 1.20 | Synthesized |
| Poly(acrylic acid) | PAA1 | 20.5 | 1.10 | Synthesized |
| | PAA2 | 750 | N.A. | Sigma-Aldrich |
| Poly(methyl methacrylate) | PMMA | 24.0 | 1.25 | Polymer Source |
| Poly(vinyl chloride) | PVC | 35.0 | 1.77 | Sigma-Aldrich |
| Poly(tert-butyl acrylate) | PtBA | 12.0 | 1.16 | Synthesized |

Silane Deposition on $Cu/SiO_2$ and $TiN/SiO_2$.

Figure 3A:
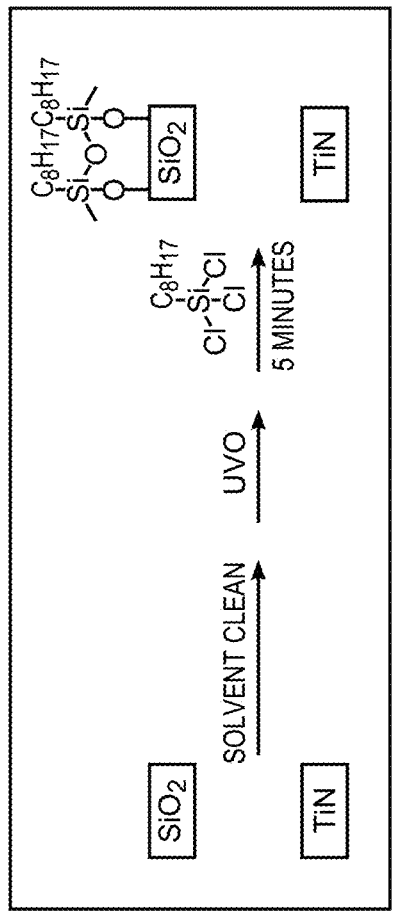
FIG. 3A illustrates selective deposition of octyltrichlorosilane (OTS) only on silicon dioxide ($SiO_2$) versus no deposition on titanium nitride (TiN). UVO=ultraviolet ozone treatment.
Figure 3B:
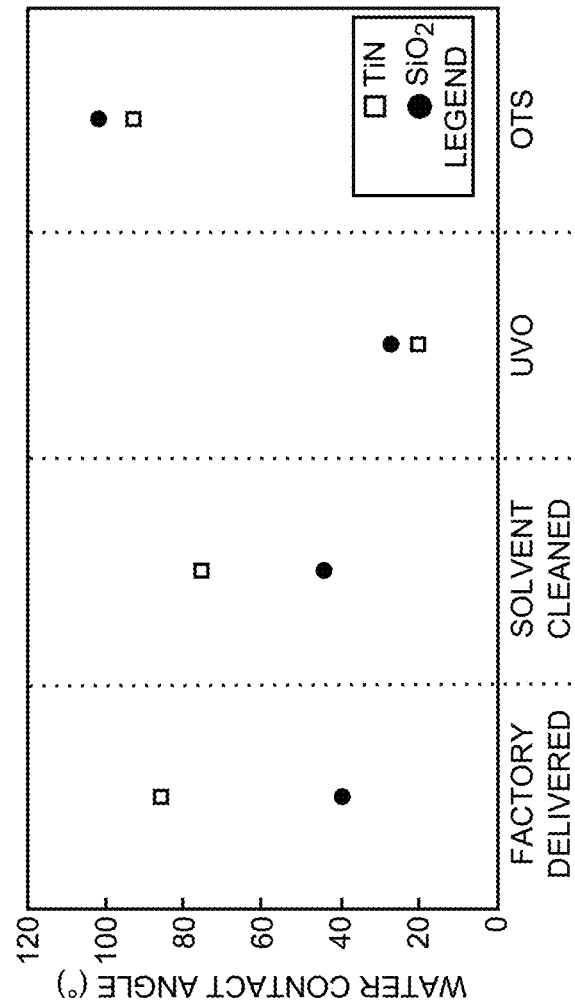
FIG. 3B is a plot showing water contact angles monitored after each step performed in FIG. 3A. UVO=ultraviolet ozone treatment.

Homogeneous $SiO_2$ and heterogeneous $TiN/SiO_2$ substrates were cleaned by sonication in acetone, isopropanol, and MilliQ® water for 3 minutes each, followed by ultraviolet ozone (UVO) treatment in a Model 18 UVO cleaner (Jelight, USA) for 10 minutes. The substrates were immersed without stirring in 5 mM alkyltrichlorosilane solution in toluene for 5 minutes unless otherwise noted. The substrates were sonicated in toluene and acetone for 3 minutes each to remove excess silane. Water contact angle measurements indicate that silane preferentially covers TiN in the presence of $SiO_2$, as shown in FIGS. 3A and 3B. Note that the TiN surface returns to approximately the as-received value after processing, while the $SiO_2$ contact angle significantly increases as the result of functionalization with a hydrophobic SAM. Heterogeneous $Cu/SiO_2$ substrates were sonicated in acetone, isopropanol, and MilliQ® water for 3 minutes each, treated with the same UVO cleaner for 10 minutes, and sonicated in acetic acid for 5 minutes and acetone for 3 minutes prior to immersion in 5 mM alkyltrichlorosilane solution in toluene for 5 minutes unless otherwise noted. The substrates were then sonicated in toluene for 3 minutes, acetone for 3 minutes, acetic acid for 5 minutes, and acetone for 3 minutes.

Spin Coating Conditions.

A droplet of 15 μL polymer solution (e.g., 50 mg/mL of polystyrene in toluene or poly(acrylic acid) in 50/50 vol % dioxane/methanol) was dispensed by a micropipette to fully cover the substrate and immediately spun at 10,000 rpm for 60 s at a ramp rate of 3 s using a 6800 Spin Coater (Speciality Coating Systems, USA) unless otherwise described.

Surface Characterization.

Secondary ion mass spectrometry (SIMS) imaging was performed using a Camera IMS 7f system (Camera SAS, Gennevilliers, France) with a 15 keV caesium beam on an analytical area of 200 μm$^2$ by monitoring $^{28}Si$ and $^{12}C$ signals. The sample was coated with a 5-nm-thick layer of gold to both neutralize charge accumulation during SIMS scanning and stabilize the primary ion beam prior to any SIMS etching. The carbon signal from the entire 200 μm$^2$ area was monitored to determine if the primary ion had fully etched away the gold layer, immediately after which SIMS imaging was conducted. The final images represent an average over approximately 100 slices at different distances from the substrate. Tapping mode atomic force microscopy (AFM) experiments were performed using a Multimode system (Veeco, USA) to investigate the surface. Measurements were conducted using commercial silicon cantilevers (resonant frequency: 190 kHz; force constant: 48 N/m; model: Tap190AI-G, NanoAndMore USA). Polymer film thickness on homogeneous surfaces was determined by an alpha-SE spectroscopic ellipsometer (J.A. Woollam Co.) or a DektakXT Stylus Profilometer (Bruker Corporation). Optical micrographs were captured with an Olympus BX51 optical microscope in reflectance mode. Contact angle measurements were performed using a ramé-hart Model 290 advanced goniometer. Deionized water was dispensed to measure static contact angles. Snapshots were taken immediately after deposition of the water droplets and analyzed by DROPimage Advanced.

Results and Discussion

Spin Dewetting on Homogeneous Surfaces

Figure 4A:
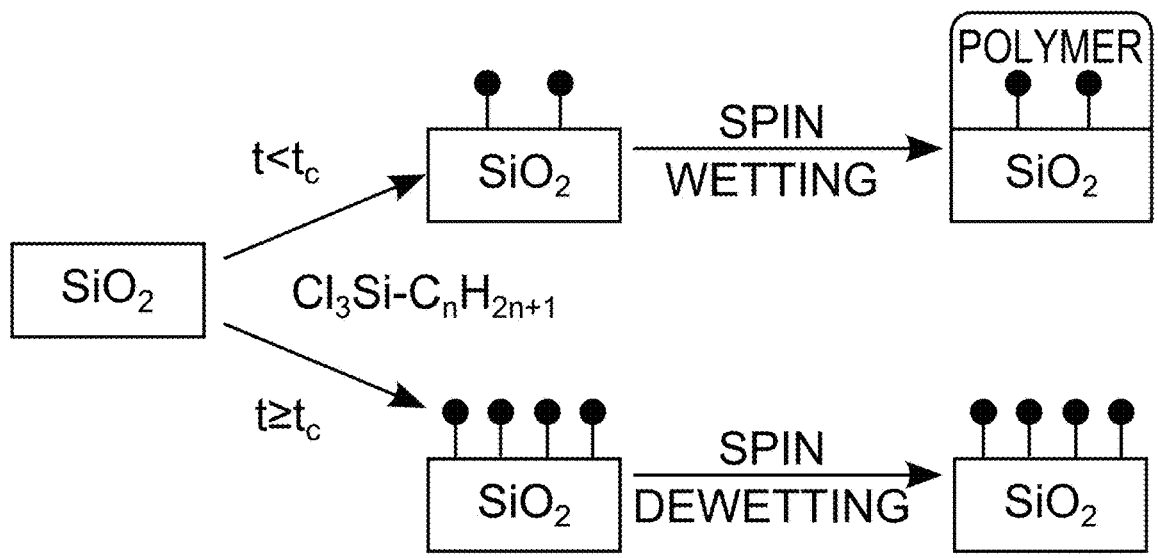
FIG. 4A is a diagram of homopolymer dewetting on homogeneous $SiO_2$ functionalized with an alkylsilane SAM. Spin dewetting or lack thereof depends on the SAM deposition time t.
Figure 4B:
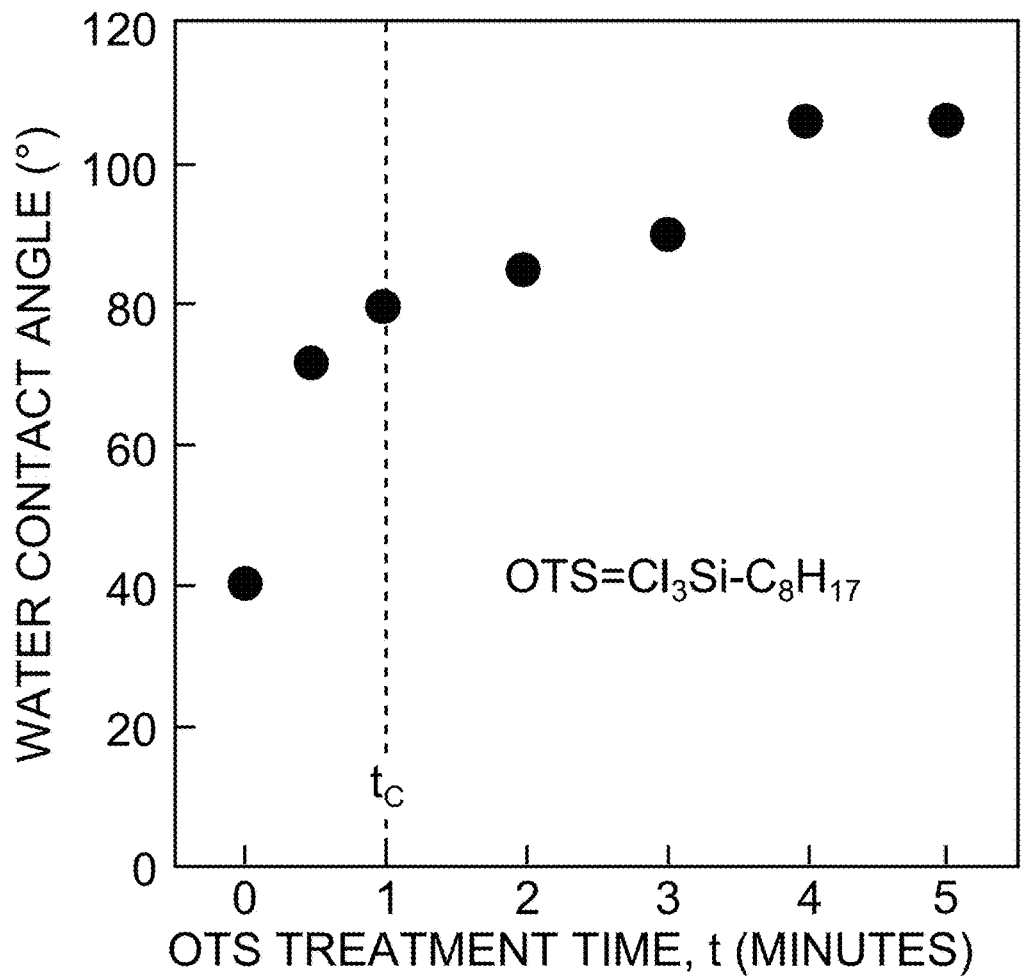
FIG. 4B is a plot showing water contact angle measurements as a function of OTS SAM deposition time (t).
Figure 5:
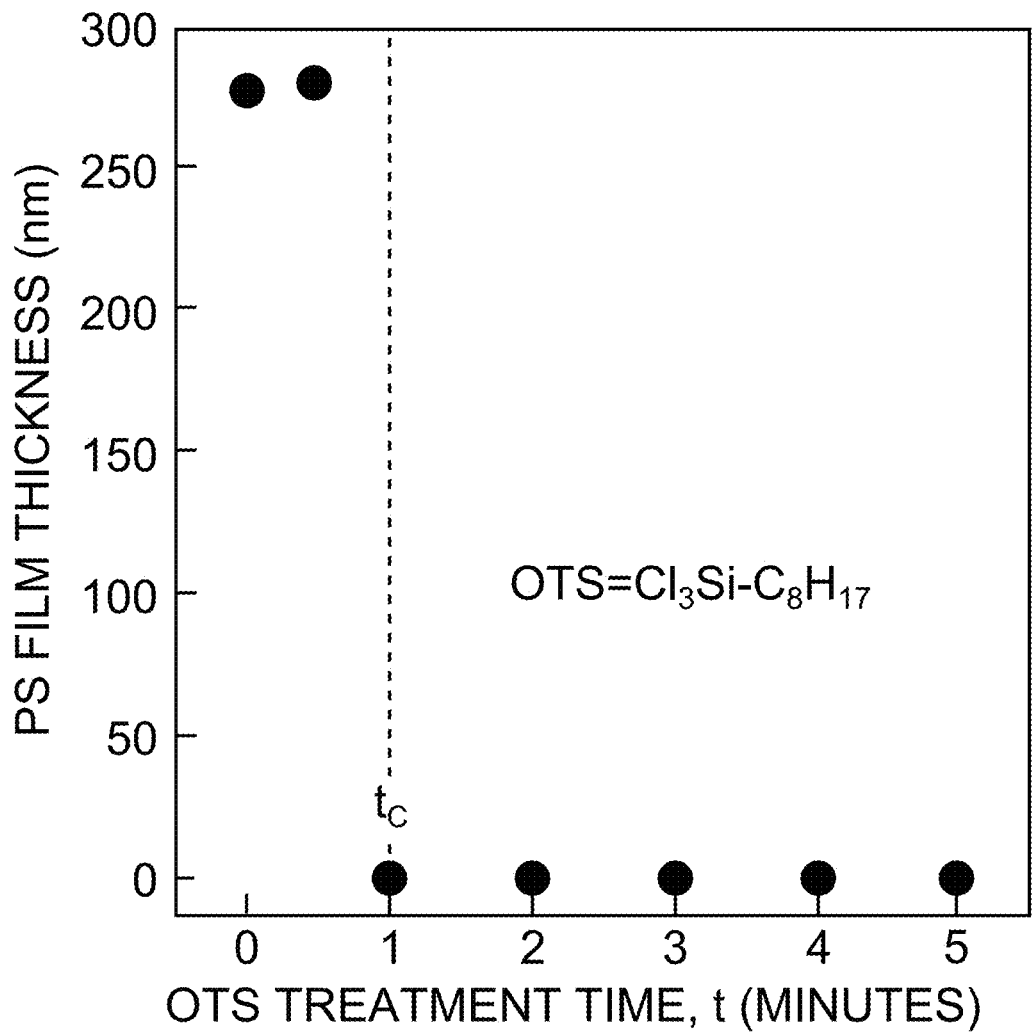
FIG. 5 is a plot showing that spin dewetting of polystyrene (PS) occurs after a critical OTS treatment time ($t_c$) as indicated by ellipsometry film thickness measurements, with data points that correspond to the samples in FIG. 4B.

Spin dewetting on partially formed SAMs was initially examined using homogeneous surfaces. As depicted in FIG. 4A, $SiO_2$ substrates were submersed in alkyltrichlorosilane solutions and the surface silanol groups reacted for varying amounts of time (t) to control surface coverage. For example, using OTS, an increase in the water contact angle with t, shown in FIG. 4B, indicates a higher SAM coverage due to alkyl chain hydrophobicity. Spin coating polystyrene on these OTS-functionalized surfaces indicates that spin dewetting occurs after a critical time $t_c \approx 1$ min, as shown in FIG. 5, which corresponds with incomplete SAM coverage. Spin coating conditions for FIGS. 4A, 4B, and 5 were as follows: polystyrene, 21.5 kDa, 5 wt % in toluene at 10 k rpm. Spin coating of polystyrene on these surfaces was then quantified by ellipsometry and optical microscopy and correlated with the water contact angle of the surface. FIG. 4B captures the result of these experiments: a transition from spin wetting to spin dewetting on OTS-functionalized $SiO_2$. This reproducible transition is observed at a critical time ($t_c \approx 1$ min), well before the plateau in water contact angle (onset circa 4 min), suggesting that silanol functionalization is incomplete at shorter times. Analogous experiments with poly(acrylic acid) spin coated from 50/50 vol % dioxane/methanol yielded identical conclusions. Homogeneous $SiO_2$ surfaces partially functionalized with an OTS SAM thus induce spin dewetting of polar (poly(acrylic acid)) and non-polar (polystyrene) polymers. This behavior still persists after extended storage of the OTS-$SiO_2$ substrate (e.g., 1 year) under ambient conditions, which illustrates the robustness of this surface functionalization process and the ability to control spin dewetting with incomplete grafting densities. As discussed subsequently, the specific choice of alkyl group allows for further tuning of the critical deposition time t, by varying the hydrophobic SAM chemistry.

Having established that spin dewetting can be induced by incomplete SAMs, the role of spin coating conditions was systematically investigated. For these experiments, $SiO_2$ substrates were treated with OTS for 5 min prior to spin coating polystyrene with varying molecular weights at different spin speeds and concentrations. FIG. 6A shows the film thickness as a function of spin speed for 5 wt % solutions of polystyrene in toluene on unfunctionalized $SiO_2$ surfaces (open symbols). As expected, film thickness decreases monotonically with increasing spin speeds and lower solution viscosity (smaller molecular weight or reduced concentration). In direct contrast, on OTS-$SiO_2$ surfaces (filled black symbols) complete dewetting is observed at low spin speeds with no polymer deposited. Significantly, a sharp transition occurs at spin speeds of ≈4 k rpm, termed ω*, after which continuous films are formed with thicknesses comparable to those on native $SiO_2$ substrates. Similar abrupt transitions from spin dewetting to spin wetting are observed for increasing polymer concentration, 2.3 wt % as shown in FIG. 6B, and polystyrene molecular weight, 30 kDa as shown in FIG. 6C. Note that the polystyrene film thickness is nearly identical on $SiO_2$ and OTS-$SiO_2$ after the spin-dewetting transition in all cases. Spin coating conditions were as follows: FIG. 6A, polystyrene, 51.0 kDa, 5 wt % in toluene at varying spin speeds from 2 k to 10 k rpm; FIG. 6B, polystyrene, 51.0 kDa, in toluene at 5 k rpm with varying weight concentration; and FIG. 6C, polystyrene, 5 wt % in toluene at 5 k rpm with varying molar mass.

This unique transition between spin dewetting and spin wetting on homogeneous surfaces is attributed to a competition between polymer dewetting and solvent evaporation. During the course of spin coating, surface hydrophobicity of the grafted alkylsilane in conjunction with centrifugal forces exerted on the fluid drive polymer dewetting. This behavior is opposed by solvent evaporation, which increases solution viscosity and reduces polymer chain mobility until eventual film vitrification. Lower spin speeds, molecular weight, and polymer concentration all favor dewetting before solidification. Such an interpretation is further supported by estimates of solution viscosity using an empirical equation; the spin wetting-to-dewetting transitions observed herein for molecular weight and concentration occur around the same viscosity ≈0.584 mPa·s, as shown in FIGS. 7A and 7B. The viscosity was calculated using the following empirical equation:

$$\mu_0 = -5.26 + (6.51 \times 10^{-2} + 1.326 \times 10^{-6} M)c + (1.52 \times 10^{-3} - 3.497 \times 10^{-8} M)c^2 - (4.309 \times 10^{-6} - 3.022 \times 10^{-10} M)c^3 + (8280 + 458c - 15.55c^2 + 0.255c^3)$$

where $\mu_0$ is the viscosity at zero shear rate, M is the weight-average molecular weight of polystyrene, c is the solution concentration (wt %), and T is absolute temperature (K). Note that this equation was developed for polystyrene with a weight average molecular weight from 28 kDa to 780 kDa in toluene and is therefore an approximation for the samples used herein. The data points correspond to the samples of FIGS. 6B and 6C.

Since dewetting during spin coating is driven by the unfavorable interfacial interactions between the substrate grafted with alkylsilane and the polymer solution, tuning SAM hydrophobicity is hypothesized to allow further control over spin dewetting. To investigate this possibility, $SiO_2$ wafers were functionalized with alkyltrichlorosilane ($Cl_3Si$—$C_nH_{2n+1}$) of different chain lengths: BTS (n=4), OTS (n=8), DDTS (n=12), and ODTS (n=18), as shown in FIG. 8. Data correspond to film thickness of polystyrene versus spin speed on $SiO_2$ functionalized with alkyltrichlorosilanes ($Cl_3Si$—$C_nH_{2n+1}$): BTS, n=4; OTS, n=8; DDTS, n=12; and ODTS, n=18. Spin coating conditions were as follows: polystyrene, 51.0 kDa, 5 wt % in toluene at varying spin speeds from 2 k-10 k rpm. Note that all SAMs were deposited for 5 minutes, and there may be different $t_c$ and plateau times for each, in analogy to FIGS. 4A and 4B. As expected, longer alkyl chains render the $SiO_2$ surface more hydrophobic as evidenced by static water contact angle measurements, as shown in FIG. 9. Water contact angle measurements are for BTS (n=4), OTS (n=8), DDTS (n=12), and ODTS (n=18) coated on a homogeneous $SiO_2$ substrate. Significantly, for the longest alkyl chain, ODTS-$SiO_2$ (n=18), polystyrene dewets across the entire range of accessible spin speeds (2 k-10 k rpm), while decreasing the alkyl chain length from ODTS (n=18) to DDTS (n=12) and OTS (n=8) results in well-defined spin dewetting-to-wetting transitions depending on the spin speed. This sharp transition ω* is observed at 8.3 k rpm for DDTS (n=12) and 4.0 k rpm for OTS (n=8). Further decreasing the alkyl chain length to BTS (n=4) results in the disappearance of a spin dewetting regime, with polystyrene coating the surface across the entire range of tested spin speeds (2 k-10 k rpm). The data in FIG. 8 clearly indicate that the spin dewetting regime can be controlled by varying the chemistry of grafted SAMs. Increased hydrophobicity leads to a wider window for spin dewetting.

The versatility of SAM-induced spin dewetting was then demonstrated by extension to a wide range of other polymers. For example, a variety of glassy polymers spanning different polarities, including poly(acrylic acid), poly(lactide), poly(vinyl chloride), poly(methyl methacrylate), and poly(tert-butyl acrylate) all exhibit a spin dewetting-to-wetting transition. Interestingly, the critical concentration at which this crossover occurs depends on polymer polarity, as shown in FIGS. 10A, 10B, 10C, and 10D. Spin coating conditions were as follows: poly(tert-butyl acrylate): 12 kDa, 5 k rpm, varying concentration in toluene (FIG. 10A); poly(acrylic acid) (PAA2): 750 kDa, 6 k rpm, varying concentrations in methanol (FIG. 10B); poly(vinyl chloride): 35 kDa, 4 k rpm, varying concentration in methyl ethyl ketone (FIG. 10C); poly(methyl methacrylate): 24 kDa, 4 k rpm, varying concentration in toluene (FIG. 10D). This transition is also evident for rubbery polymers at 25° C. such as poly(butadiene) and poly(ethylene oxide), with two important differences. The crossover from spin wetting to dewetting is not as sharp, and in this intermediate zone the polymer partially dewets to form holes or droplets, as shown in FIGS. 10E and 10F for poly(butadiene) and poly(ethylene oxide), respectively. Spin coating conditions were as follows: polybutadiene: 93 kDa, 5 k rpm, varying concentration in toluene; poly(ethylene oxide): 36 kDa, 3 k rpm, varying concentration in 1:1 ethanol and toluene mixture. In addition, the structures formed in the intermediate regime are unpredictable and inconsistent. Finally, a wetting/dewetting transition is also evident for poly(methyl acrylate) bottlebrush polymers, indicating that the spin dewetting transition is not limited to linear polymers. The ubiquitous presence of a spin dewetting-to-wetting transition in all the materials described previously suggests that this is a general phenomenon that can be tuned through structural and processing factors.

Spin Dewetting on Heterogeneous Surfaces

After demonstration of spin dewetting on homogeneous substrates, heterogeneous surfaces were investigated to probe the relationship between selectivity and SAM coverage. Equal line-space patterns of copper or TiN on $SiO_2$ were prepared by photolithography, as shown in FIGS. 11A to 11F and FIGS. 12A to 12F, with the deposition of copper and TiN resulting in minimal topography (circa 5 nm) compared with the lateral pitch (≥10 μm). In examining the spin dewetting process on heterogeneous surfaces, two key steps were considered, as shown in FIG. 13: (1) preferential deposition of a SAM on select surfaces to promote local dewetting, and (2) selective deposition of polymer over other regions via subsequent spin coating. Based on the data presented in FIG. 8, OTS (n=8) was chosen as a model for preliminary studies since it places ω* at a convenient spin speed.

As-fabricated $Cu/SiO_2$ and $TiN/SiO_2$ line-space patterns were therefore treated with OTS (n=8) for different lengths of time (t). At times greater than $t_c$>1 min (compare with the homogeneous surfaces shown in FIG. 4B), OTS induces spin dewetting of both poly(acrylic acid) on Cu/OTS-$SiO_2$ and polystyrene on TiN/OTS-$SiO_2$ to give spatial localization of the polymer film only on the copper or TiN areas, as shown in FIG. 14A to 14D. Spin coating conditions were as follows: polystyrene, 21.5 kDa, 5 wt % in toluene at 10 k rpm; and poly(acrylic acid), 20.5 kDa, 5 wt % in 50/50 vol % dioxane/methanol at 10 k rpm. In contrast, below $t_c$, polystyrene and poly(acrylic acid) solutions coat the entire substrate, leading to a continuous film. This significant difference illustrates the role that partial SAM functionalization, with application time t>$t_c$, plays in promoting spin dewetting on heterogeneous surfaces. Note the contrast with other selective deposition techniques requires much more uniform SAMs to achieve area selectivity, for example, area-selective atomic layer deposition.

To further probe film coverage on heterogeneous surfaces, patterns of poly(acrylic acid) formed by spin dewetting on equal line-space patterns of Cu/OTS-$SiO_2$ (40 μm pitch) were analyzed by SIMS. Compared with background and control samples, carbon signals for poly(acrylic acid) films were only observed over areas corresponding to the underlying copper lines, which indicates a high degree of pattern fidelity, as shown in FIGS. 15A and 15B and FIG. 16. For FIGS. 15A and 15B, spin coating conditions were as follows: poly(acrylic acid), 20.5 kDa, 5 wt % in 50/50 vol % dioxane/methanol at 10 k rpm. Similarly, spin coating polystyrene on TiN/OTS-$SiO_2$ results in the deposition of polymer only on the patterned TiN areas as evidenced by SIMS analysis, shown in FIGS. 17A to 17C. The presence of carbon signals over TiN in the as-fabricated pattern is consistent with literature that indicates TiN can absorb carbon upon exposure to air. After spin dewetting, the exclusive presence of carbon on TiN stripes indicates that no polymer was deposited on OTS-$SiO_2$. Together with the height change before and after spin coating, as shown in FIGS. 20D and 16, the conclusion is that polymer only coats TiN. Spin coating conditions were as follows: polystyrene (PS4), 21.5 kDa 5 wt % in toluene at 10 k rpm. Also note that in principle a carbon signal should be detected over $SiO_2$ via SIMS imaging after modification with an alkyl SAM. However, experimentally, the images represent an average of over approximately 100 slices at different distances from the substrate. Carbon signals were in fact sometimes observed during some individual scans, but given the extremely thin nature of the SAM, this effect is washed out during averaging. In both cases, deposition of the polymers also creates templated films that are observable by AFM, as shown in FIGS. 18A to 18C and FIGS. 19A to 19C. For FIGS. 18A to 18C, spin coating conditions were as follows: poly(acrylic acid) (PAA1), 20.5 kDa, 5 wt % in 50/50 vol % dioxane/methanol at 10 k rpm. For FIGS. 19A to 19C, spin coating conditions were as follows: polystyrene (PS4), 21.5 kDa 5 wt % in toluene at 10 k rpm. Collectively, these data indicate that the spin dewetting process, under optimal conditions, is efficient at selectively coating heterogeneous substrates with no detectable deposition of polymers over regions that dewet.

To illustrate the broad applicability of this spin dewetting approach, selective deposition over different pitch sizes ranging from 10 μm to 40 μm was examined. FIGS. 20A to 20D show AFM data demonstrating the dependence of spin dewetting on pre-pattern dimensions for both poly(acrylic acid) on Cu/OTS-$SiO_2$ and polystyrene on TiN/OTS-$SiO_2$. Spin coating conditions were as follows: polystyrene, 21.5 kDa, 5 wt % in toluene at 10 k rpm; and poly(acrylic acid), 20.5 kDa, 5 wt % in 50/50 vol % dioxane/methanol at 10 k rpm. In both cases, the height of resulting polymer features decreases with pitch (P), reaching approximately 30 nm for 5 μm lines of copper or TiN. Also note that there is some variability in the height profile of different lines at the same pitch on a given wafer. For example, the downward slope of poly(acrylic acid) covering copper at P=40 μm, shown in FIG. 20B, can be more or less prominent, and the difference between polystyrene spike height at the boundaries of TiN lines, shown in FIG. 20D, varies on the order of 20 nm.

As is apparent in FIGS. 20A to 20D, distinct differences between the morphology of spin dewet poly(acrylic acid) and polystyrene are a result that is consistently observed across replicate samples. Polystyrene tends to form spikes at the boundaries of TiN—and copper, shown in FIGS. 21A and 21B—while poly(acrylic acid) features on copper are more rounded. White dashed lines show the edges of the second surface 18 that in this instance is copper. For FIGS. 21A and 21B, spin coating conditions were as follows: polystyrene (PS4), 21.5 kDa 5 wt % in toluene at 10 k rpm. A complicated interplay involving polymer, solvent, and surface interactions is speculated to influence these results. Water contact angles indicate the native copper surface is significantly more polar than TiN, as shown in FIGS. 22A and 22B, which further explains (1) why polystyrene (nonpolar) coats Cu/OTS-$SiO_2$, as shown in FIGS. 21A and 21B, with worse fidelity than TiN/OTS-$SiO_2$, as shown in FIG. 20C, and (2) why poly(acrylic acid) (polar) dewets from TiN, as shown in FIGS. 23A and 23B. Spin coating conditions were as follows: poly(acrylic acid) (PAA1), 20.5 kDa, 5 wt % in 50/50 vol % dioxane/methanol at 10 k rpm. As expected, the thickness of as-deposited material and to a lesser extent the shape of polymer features also depends on solution concentration, as shown in FIGS. 24A and 24B. In contrast, the deposited film thickness changes significantly with concentration. For polystyrene, the edge spike height increases from ≈80 nm (5 wt %) to 160 nm (20 wt %), while the center increases from 20 nm (5 wt %) to 75 nm (20 wt %). Similarly, for poly(acrylic acid), the average film thickness decreases from ≈70 nm (5 wt %) to 12 nm (1 wt %). However, no processing conditions have been identified that circumvent the formation of U-shaped films with polystyrene on TiN, in contrast to using polymer/polymer pre-patterns.

Based on the successful patterning of disparate polymeric thin films on TiN-based and copper-based substrates, the general principle of spin dewetting is expected to enable additional combinations of polymers and substrates to be rationally designed. This versatility also proves critical for scaling the selective deposition of polymers to higher resolution pre-patterns. Preliminary data across μm, 20 μm, and 10 μm pitches indicate polystyrene scales well on TiN, shown in FIGS. 20C and 20D, but not on copper, shown in FIGS. 21A and 21B. Poly(acrylic acid) exhibits the opposite trend, as shown in FIGS. 20A and 20B and in FIGS. 23A and 23B. These observations further support the aforementioned importance of surface-polymer interactions in mediating effective spin dewetting.

Comparison to Traditional Dewetting

The kinetic arrest of polymer thin films during spin dewetting on heterogeneous substrates can generate unique structures that are otherwise inaccessible with traditional types of dewetting or self-assembly. FIGS. 25A to 25E compare thermal dewetting on a TiN/OTS-SiO$_2$ pattern starting from (1) polystyrene confined over the TiN via spin dewetting from toluene, shown in FIG. 25B, and (2) a continuous film of polystyrene formed using tetrahydrofuran as the casting solvent, as shown in FIG. 25C. Spin coating conditions were as follows: polystyrene, 21.5 kDa, 5 wt % at 10 k rpm in toluene (FIG. 25B) and tetrahydrofuran (FIG. 25C). In both cases, thermal dewetting creates droplets, shown in FIGS. 25D and 25E that are distinct from those shown in FIGS. 20A to 20D. For FIGS. 25A to 25E, all images were taken with the same light intensity and exposure time. Thermal dewetting conditions were as follows: substrates with polymer films were annealed at 170° C. for 1 hr in high vacuum (≈4×10$^{-8}$ Torr). The propensity of polystyrene to thermally dewet from TiN, and copper as shown in FIGS. 26A and 26B, is attributed to the weak attractive forces mentioned previously. Droplets of the polymer coating are shown localized near the edges of the copper in FIG. 26B. In contrast, poly(acrylic acid) still adheres to copper at 170° C. after 1 hour; further thermal annealing at 240° C. results in a cross-linked film, shown in FIGS. 27A to 27C, that remains essentially indistinguishable from the as-spin-dewet structure. This concept could thus be exploited with other types of cross-linkers to immobilize various polymer chemistries using heat and/or light. Finally, solvent evaporation on tilted surfaces can produce interesting multi-scale dewetting patterns of polymer blends that exhibit macroscopic alignment; these too are different from the spin dewet structures described herein.

In summary, spin dewetting is a powerful technique for controlling polymer thin film formation on homogeneous and heterogeneous surfaces using incomplete SAMs to drive dewetting. The transition between complete wetting and dewetting for glassy polymers is sharp and depends on polymer chemistry, processing variables, and SAM selection. Using octyltrichlorosilane-functionalized SiO$_2$, the selective deposition of polystyrene on TiN/SiO$_2$ and poly (acrylic acid) on Cu/SiO$_2$ was successfully demonstrated. Secondary ion mass spectrometry indicates clean dewetting over the SAM-functionalized region at the pitches tested (10 μm to 40 μm). The morphology of polymer spin dewet onto copper or TiN significantly varies from rounded edges to spike-like boundary features. Under optimized processing conditions, spin dewetting generates structures that complement those available via other thermal dewetting or self-assembly techniques. These results are anticipated to prove enabling for applications that necessitate simple control over the spatial distribution of polymeric thin films.

Those skilled in the art will recognize improvements and modifications to the preferred embodiments of the present disclosure. All such improvements and modifications are considered within the scope of the concepts disclosed herein and the claims that follow.

What is claimed is:

1. A method of selectively coating a structure comprising:
   providing a structure having:
     a first portion of a first material and having a first surface;
     a second portion of a second material and having a second surface,
     wherein a mask is over the first surface;
   cleaning the structure by sonification in at least one solvent;
   exposing the structure to ultraviolet ozone (UVO);
   dispensing a liquid solution comprising a polymer and a solvent onto the mask and the second surface, wherein the liquid solution has a chemistry tuned to transition from spin wetting to spin dewetting at a critical time as the solvent evaporates as the structure is spinning; and
   spinning the structure for at least the critical time to achieve the spin dewetting of the liquid solution from the first surface and the mask causing the polymer to collect onto the second surface to form a polymer coating over the second surface without forming a polymer coating over the first surface.

2. The method of selectively coating the structure of claim 1 wherein the first material is a dielectric and the second material is an electrical conductor.

3. The method of selectively coating the structure of claim 1 wherein the first material is an electrical conductor and the second material is a dielectric.

4. The method of selectively coating the structure of claim 1 wherein the first material is silicon dioxide and the second material is copper.

5. The method of selectively coating the structure of claim 1 wherein the first material is silicon dioxide and the second material is titanium nitride.

6. The method of selectively coating the structure of claim 1 wherein the mask comprises a self-assembled monolayer.

7. The method of selectively coating the structure of claim 1 wherein the mask comprises a silane coupling agent.

8. The method of selectively coating the structure of claim 7 wherein the silane coupling agent is an alkyl-trichlorosilane.

9. The method of selectively coating the structure of claim 7 wherein the silane coupling agent is octyltrichlorosilane.

10. The method of selectively coating the structure of claim 1 wherein the mask is hydrophobic.

11. The method of selectively coating the structure of claim 1 wherein the polymer is a non-polar polymer.

12. The method of selectively coating the structure of claim 11 wherein the non-polar polymer is polystyrene.

13. The method of selectively coating the structure of claim 1 wherein the polymer is a polar polymer.

14. The method of selectively coating the structure of claim 13 wherein the polar polymer is poly(acrylic acid).

15. A method of selectively coating a structure comprising:

providing a structure having:
  a first portion of a first material and having a first surface;
  a second portion of a second material and having a second surface;
cleaning the structure by sonification in at least one solvent;
exposing the structure to UVO;
providing a liquid solution comprised of a polymer and a solvent, wherein the liquid solution has a tuned chemistry to transition from spin wetting to spin dewetting at a critical time as the solvent evaporates as the structure is spinning to coat the second surface, and a coupling agent having a chemistry to couple with the first material;
dispensing the liquid solution onto the first surface and onto the second surface; and
spinning the structure for at least the critical time, wherein the coupling agent couples to the first material to form a mask from which the liquid solution dewets during the spinning of the structure such that the polymer collects onto the second surface to form a polymer coating over the second surface without forming a polymer coating on the first surface.

16. The method of selectively coating the structure of claim 15 wherein the first material is a dielectric and the second material is an electrical conductor.

17. The method of selectively coating the structure of claim 15 wherein the first material is an electrical conductor and the second material is a dielectric.

18. The method of selectively coating the structure of claim 15 wherein the first material is silicon dioxide and the second material is copper.

19. The method of selectively coating the structure of claim 15 wherein the first material is silicon dioxide and the second material is titanium nitride.

20. The method of selectively coating the structure of claim 15 wherein the mask comprises a self-assembled monolayer.

21. The method of selectively coating the structure of claim 15 wherein the coupling agent is a silane coupling agent.

22. The method of selectively coating the structure of claim 21 wherein the silane coupling agent is an alkyltrichlorosilane.

23. The method of selectively coating the structure of claim 21 wherein the silane coupling agent is octyltrichlorosilane.

24. The method of selectively coating the structure of claim 15 wherein the mask is hydrophobic.

25. The method of selectively coating the structure of claim 15 wherein the polymer is a non-polar polymer.

26. The method of selectively coating the structure of claim 25 wherein the non-polar polymer is polystyrene.

27. The method of selectively coating the structure of claim 15 wherein the polymer is a polar polymer.

28. The method of selectively coating the structure of claim 27 wherein the polar polymer is poly(acrylic acid).

29. The method of selectively coating the structure of claim 15 wherein the exposing the structure to UVO is for a period of at least 10 minutes.

* * * * *